US012615847B2

(12) United States Patent
Yu et al.

(10) Patent No.: US 12,615,847 B2
(45) Date of Patent: Apr. 28, 2026

(54) INTEGRATED CIRCUIT INCLUDING STANDARD CELLS, AND METHOD OF DESIGNING THE INTEGRATED CIRCUIT

(71) Applicant: Samsung Electronics Co., Ltd., Suwon-si (KR)

(72) Inventors: Jisu Yu, Seoul (KR); Jungho Do, Hwaseong-si (KR); Jaewoo Seo, Seoul (KR); Hyeongyu You, Hwaseong-si (KR); Minjae Jeong, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 792 days.

(21) Appl. No.: 17/670,626

(22) Filed: Feb. 14, 2022

(65) Prior Publication Data

US 2022/0262786 A1     Aug. 18, 2022

(30) Foreign Application Priority Data

Feb. 18, 2021    (KR) ........................ 10-2021-0022126
Apr. 14, 2021    (KR) ........................ 10-2021-0048671

(51) Int. Cl.
H10D 89/10         (2025.01)
H10D 84/90         (2025.01)
(52) U.S. Cl.
CPC ........... H10D 89/10 (2025.01); H10D 84/907 (2025.01); H10D 84/912 (2025.01); H10D 84/951 (2025.01); H10D 84/981 (2025.01); H10D 84/985 (2025.01)

(58) Field of Classification Search
CPC ..... H10D 89/10; H10D 84/907; H10D 84/909
See application file for complete search history.

(56) References Cited

U.S. PATENT DOCUMENTS

| | | |
|---|---|---|
| 7,800,409 B2 | 9/2010 | Pitts |
| 8,276,109 B2 | 9/2012 | Penzes et al. |
| 8,878,303 B2 | 11/2014 | Hatamian et al. |
| 9,449,136 B2 | 9/2016 | Pan et al. |
| 10,503,859 B2 | 12/2019 | Pelloie |
| 10,713,410 B2 | 7/2020 | Wang et al. |

(Continued)

FOREIGN PATENT DOCUMENTS

| | | |
|---|---|---|
| KR | 1020200018134 A | 2/2020 |
| TW | 200814279 A | 3/2008 |

(Continued)

*Primary Examiner* — Mounir S Amer
*Assistant Examiner* — Alexander Belousov
(74) *Attorney, Agent, or Firm* — Muir Patent Law, PLLC

(57) ABSTRACT

An integrated circuit including a first standard cell placed continuously on a row having a first height and a row having a second height different from the first height. The integrated circuit also includes a second standard cell continuously placed on a row having the first height and a row having the second height, a plurality of first power lines formed on boundaries of the plurality of rows and configured to supply a first supply voltage to the standard cells, and a plurality of second power lines formed on boundaries of the plurality of rows and configured to supply a second supply voltage to the standard cells. A placement sequence of the power lines supplying a voltage to the first standard cell being different from a placement sequence of the power lines supplying a voltage to the second standard cell.

18 Claims, 18 Drawing Sheets

<SINGLE HEIGHT BLOCK>

<MIXED HEIGHT BLOCK>

< MIXED HEIGHT BLOCK >

(56) References Cited

U.S. PATENT DOCUMENTS

| | | | | |
|---|---|---|---|---|
| 10,733,352 | B2 | 8/2020 | Chen et al. | |
| 10,755,018 | B2 | 8/2020 | Ryu et al. | |
| 10,797,078 | B2 | 10/2020 | Lai et al. | |
| 10,817,640 | B2 | 10/2020 | Kim et al. | |
| 10,868,538 | B1 * | 12/2020 | Wang | H03K 19/17736 |
| 10,878,158 | B2 * | 12/2020 | Lin | G06F 30/392 |
| 10,998,340 | B2 * | 5/2021 | Guo | H01L 29/6681 |
| 11,011,545 | B2 * | 5/2021 | Guo | H01L 27/0207 |
| 11,121,155 | B2 * | 9/2021 | Do | H10D 84/907 |
| 11,152,348 | B2 | 10/2021 | Sio et al. | |
| 11,256,844 | B2 * | 2/2022 | Ku | H01L 23/528 |
| 11,263,378 | B2 * | 3/2022 | Ou | G06F 30/392 |
| 11,409,937 | B2 * | 8/2022 | Lin | H04M 3/42042 |
| 11,495,592 | B2 * | 11/2022 | Lee | H01L 27/0924 |
| 11,509,293 | B2 * | 11/2022 | Wang | H03K 3/35625 |
| 11,538,757 | B2 * | 12/2022 | Le Bars | H01L 23/5226 |
| 11,675,949 | B2 * | 6/2023 | Chang | H10B 10/12 |
| | | | | 257/204 |
| 11,748,542 | B2 * | 9/2023 | Chen | G06F 30/392 |
| | | | | 257/296 |
| 11,855,632 | B2 * | 12/2023 | Wang | G06F 30/392 |
| 11,935,893 | B2 * | 3/2024 | Guo | H01L 27/11807 |
| 12,061,856 | B2 * | 8/2024 | Peng | H10D 89/10 |
| 2005/0156200 | A1 | 7/2005 | Kinoshita | |
| 2010/0289111 | A1 * | 11/2010 | Lee | G06F 30/392 |
| | | | | 257/E23.179 |
| 2013/0285049 | A1 | 10/2013 | Ohmaru et al. | |
| 2017/0116365 | A1 * | 4/2017 | Cheng | G06F 30/39 |
| 2018/0190670 | A1 | 7/2018 | Ryckaert et al. | |
| 2019/0148407 | A1 * | 5/2019 | Guo | H10D 30/0243 |
| | | | | 257/206 |
| 2019/0355749 | A1 * | 11/2019 | Do | G06F 30/39 |
| 2020/0019667 | A1 * | 1/2020 | Lin | G06F 30/398 |
| 2020/0119048 | A1 * | 4/2020 | Guo | H01L 27/0207 |
| 2020/0272781 | A1 * | 8/2020 | Chang | G06F 30/392 |
| 2021/0091769 | A1 * | 3/2021 | Wang | H10D 89/10 |
| 2021/0110094 | A1 * | 4/2021 | Lin | G06F 30/398 |
| 2021/0125926 | A1 * | 4/2021 | Le Bars | H01L 27/0207 |
| 2021/0224455 | A1 * | 7/2021 | Ou | G06F 30/392 |
| 2021/0224456 | A1 * | 7/2021 | Chen | G06F 30/398 |
| 2021/0240900 | A1 * | 8/2021 | Peng | H01L 27/0207 |
| 2021/0240901 | A1 * | 8/2021 | Ku | H10D 89/10 |
| 2021/0257388 | A1 * | 8/2021 | Guo | H01L 27/0207 |
| 2021/0391850 | A1 * | 12/2021 | Wang | H10D 30/6219 |
| 2022/0005800 | A1 * | 1/2022 | Lee | H01L 23/5286 |
| 2022/0262786 | A1 * | 8/2022 | Yu | H01L 27/11807 |
| 2024/0186326 | A1 * | 6/2024 | Guo | H01L 27/0924 |

FOREIGN PATENT DOCUMENTS

| | | |
|---|---|---|
| TW | 201838143 A | 10/2018 |
| TW | 201919239 A | 5/2019 |
| TW | 201925911 A | 7/2019 |

* cited by examiner

MC22

PL2(VSS)
RX2
D
C
RX1
PL1(VDD)
RX1
A
B
Y
RX2
PL2(VSS)

CH2

CH2

⌐ ⌐ : Cell Boundary
⊠ : M1
▦ : M2
▨ : Contact
⊘ : Gate line
⊠ : V0
⊞ : V1

Y
Z⊙ ⟶X

HC22

PL2(VSS)
RX2
Y
B
A
RX1
PL1(VDD)
RX1
C
D
RX2
PL2(VSS)

CH1
CH2

[ ] : Cell Boundary
⊠ : M1
▦ : M2
▨ : Contact
◩ : Gate line
⊠ : V0
⊞ : V1

Legend:
- ▨ : Gate line
- ▧ : Contact
- ▦ : V0
- ▨ : M1

FIG. 8B

INTEGRATED CIRCUIT INCLUDING STANDARD CELLS, AND METHOD OF DESIGNING THE INTEGRATED CIRCUIT

CROSS-REFERENCE TO RELATED APPLICATIONS

This application is based on and claims priority under 35 U.S.C. § 119 to Korean Patent Application Nos. 10-2021-0022126 filed on Feb. 18, 2021, and 10-2021-0048671 filed on Apr. 14, 2021 in the Korean Intellectual Property Office, the disclosures of which are incorporated by reference herein in their entirety.

BACKGROUND

Aspects of the inventive concept relate to an integrated circuit, and more particularly, to an integrated circuit including standard cells and a method of designing the integrated circuit.

An integrated circuit may include a plurality of cells aligned along a plurality of rows. The integrated circuit may include cells providing the same function, cells providing different functions, and cells providing the same function while providing different characteristics. For example, a cell of a plurality of cells performing the same function, selected based on characteristics, such as an operation speed, power consumption, and an area, may be included in the integrated circuit. In addition, the integrated circuit may also include single height cells placed on one row, and may also include multiple height cells continuously placed on two or more rows.

SUMMARY

Aspects of the inventive concept provide an integrated circuit including a plurality of cells, and provides an integrated circuit including standard cells and a method of designing the integrated circuit.

According to an aspect of the inventive concept, there is provided an integrated circuit including standard cells placed on a plurality of rows extending in a first horizontal direction including: a first standard cell continuously placed on a row having a first height in a second horizontal direction perpendicular to the first horizontal direction and a row having a second height in the second horizontal direction, the second height being different from the first height; a second standard cell continuously placed on a row having the first height in the second horizontal direction and a row having the second height in the second horizontal direction; a plurality of first power lines formed on boundaries of a first subset of the plurality of rows and configured to supply a first supply voltage to the standard cells; and a plurality of second power lines formed on boundaries of a second subset of the plurality of rows and configured to supply a second supply voltage to the standard cells, wherein the first standard cell and the second standard cell perform an identical function and have an identical height in the second horizontal direction, wherein, of the plurality of first power lines and the plurality of second power lines, a placement sequence in the second horizontal direction of a first set of power lines including at least one first power line and at least one second power line supplying a voltage to the first standard cell is different from a placement sequence in the second horizontal direction of a second set of power lines including at least one first power line and at least one second power line supplying a voltage to the second standard cell.

According to another aspect of the inventive concept, there is provided an integrated circuit including standard cells placed on a plurality of rows extending in a first horizontal direction including: a first cell placed on a row having a first height in a second horizontal direction perpendicular to the first horizontal direction, and the first cell having the first height; a second cell continuously placed on two or more rows, each of the two or more rows having the first height; and a third cell continuously placed on a row having the first height in the second horizontal direction and a row having a second height in the second horizontal direction, the second height being different from the first height, wherein the first cell, the second cell, and the third cell perform an identical function.

According to another aspect of the inventive concept, there is provided an integrated circuit including standard cells placed on a plurality of rows extending in a first horizontal direction including: a first standard cell placed on two or more rows, each of the two or more rows having a first height in a second horizontal direction perpendicular to the first horizontal direction; a second standard cell placed on two or more rows each of which having the first height in the second horizontal direction; a plurality of first power lines formed on boundaries of a first subset of the plurality of rows and configured to supply a first supply voltage to the standard cells; and a plurality of second power lines formed on boundaries of a second subset of the plurality of rows and configured to supply a second supply voltage to the standard cells, wherein the first standard cell and the second standard cell perform an identical function and have an identical height, wherein, of the plurality of first power lines and the plurality of second power lines, a placement sequence in the second horizontal direction of a first set of power lines including at least one first power line and at least one second power line supplying a voltage to the first standard cell is different from a placement sequence in the second horizontal direction a first set of power lines including of at least one first power line and at least one second power line supplying a voltage to the second standard cell.

According to another aspect of the inventive concept, there is provided a design method of an integrated circuit including a hybrid height cell continuously placed on a row having a first height and a row having a second height that is different from the first height, the design method including: placing standard cells including function cells on each of a plurality of rows; and in a combined region including rows having different heights from each other and adjacent to each other from among the plurality of rows, placing the hybrid height cell in a blank space in which the function cells are not placed.

BRIEF DESCRIPTION OF THE DRAWINGS

Embodiments of the inventive concept will be more clearly understood from the following detailed description taken in conjunction with the accompanying drawings in which:

FIGS. 8A and 8B are cross-sectional views of standard cells included in an integrated circuit, according to example embodiments;

DETAILED DESCRIPTION OF THE EMBODIMENTS

Hereinafter, various embodiments of the inventive concept are described in conjunction with the accompanying drawings.

Figure 1:
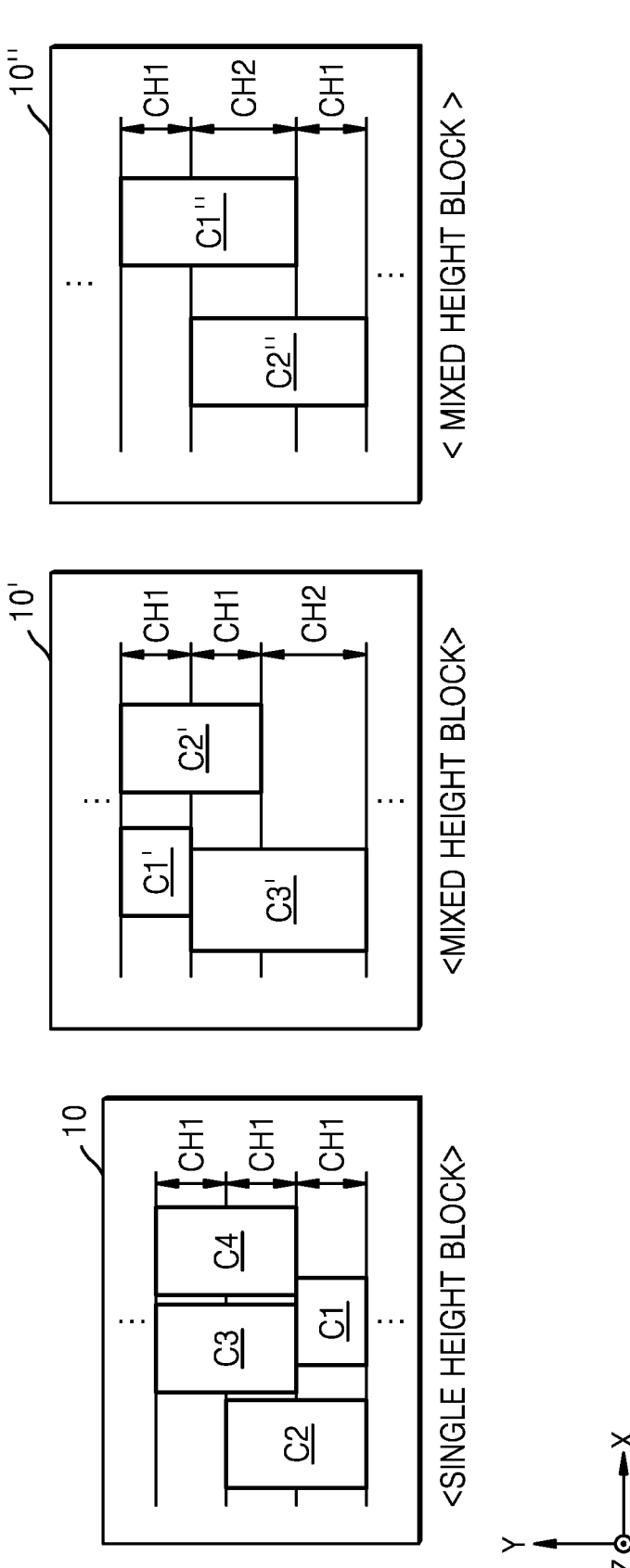
FIG. 1 illustrates diagrams of integrated circuits according to example embodiments.

FIG. 1 illustrates diagrams of integrated circuits according to example embodiments. FIG. 1 illustrates plan views of portions of integrated circuits 10, 10', and 10" constituting one chip or one function block on a plane including an X-axis and a Y-axis. In the inventive concept, the X-axis direction and the Y-axis direction may be referred to as a first horizontal direction and a second horizontal direction, respectively, and a Z-axis direction may be referred to as a vertical direction. The plane formed by the X-axis and the Y-axis may be referred to as a horizontal plane, components placed in a +Z-axis direction relative to other components may be referred to as being above the other components, and components placed in a direction opposite to the Z-axis direction relative to other components may be referred to as being under or below the other components. In addition, an area of a component may be referred to as a size occupied by the component on a plane parallel with a horizontal plane, and a height of the component may be referred to as a length of the component in the Y-axis direction. Each of the integrated circuits 10, 10', and 10" may include a plurality of standard cells. Different logic functions may be integrated into an integrated circuit (IC) using available design tools including electronic design automation (EDA) and computer aided design (CAD) tools. A standard cell includes a plurality of transistors that are used to implement logic functions. The logic functions may include Boolean functions (e.g., AND, OR, and NOT), storage functions (e.g., flip-flops, latches, and buffers), and digital combinational functions (e.g., multiplexers and demultiplexers). As utilized herein, the term "standard cell" may also be referred to as a "cell." Each standard cell may have predetermined geometry (e.g., width and height). The EDA and CAD design tools may include a library (known as a standard cell library) that stores the standard cell definitions for these logic functions. During semiconductor device design, the design tool may select one or more standard cells from the cell library based on the logic design and the process parameters (i.e., size and width of the standard cell) and places the cells in rows and columns. Upon completing the placement, the semiconductor device design may be simulated, verified, and subsequently transferred to a chip (i.e., formed in silicon). Each of the integrated circuits 10, 10', and 10" may include a plurality of various standard cells, and the standard cells may be placed and aligned on a plurality of rows.

A first power line and a second power line supplying voltages to each standard cell may be formed on a boundary of each of the plurality of rows, and the first power line and the second power line may be formed in a conductive pattern extending in the X-axis direction and placed alternately in the Y-axis direction. For example, the first power line and the second power line may be placed alternately in a ratio of 1:1 in the Y-axis direction.

The integrated circuit 10 including a single height block including rows of an identical height (for example, CH1) may include first through fourth standard cells C1 through C4. When circuits formed in the first through fourth standard cells C1 through C4 are identical, the first through fourth standard cells C1 through C4 may be referred to as performing the same function.

For example, the first cell C1 may include a single height cell placed on one row, and second through fourth cells C2 through C4 may include multiple height cells continuously placed on two or more adjacent rows. In FIG. 1, the second through fourth cells C2 through C4 are illustrated as being continuously placed on two rows, but are not limited thereto, and the same description may be applied to the standard cells continuously placed on three or more rows.

In an embodiment, the second cell C2 and the third cell C3, may perform the same function and have an identical height. However, the first power line and the second power line providing voltages to each cell of the second cell C2 and the third cell C3 may have different placement relations (different placement sequences of the first power line and the second power line). Of the plurality of first power lines and the plurality of second power lines, a placement sequence in the second horizontal direction of at least one first power line and at least one second power line providing voltages to the second cell C2 may be different from a placement sequence in the second horizontal direction of at least one first power line and at least one second power line providing voltages to the third cell C3.

In addition, the third cell C3 and the fourth cell C4 may perform the same function and have the same height. In addition, the first power line and the second power line providing voltages to each cell of the third cell C3 and the fourth cell C4 may have the same placement sequence. However, with respect to each other, the third cell C3 and the fourth cell C4 may have different shapes of conductive patterns formed therein. Of the plurality of first power lines and the plurality of second power lines, a placement sequence in the second horizontal direction of at least one first power line and at least one second power line providing voltages to the third cell C3 may be identical to a placement sequence in the second horizontal direction of at least one first power line and at least one second power line providing voltages to the fourth cell C4.

The integrated circuit 10' including mixed height blocks including rows having at least two different heights (for example, CH1 and CH2) from each other may include first through third cells C1' through C3' performing the same function. For example, the first cell C1' may include a single height cell placed on one row, and the second cell C2' may include a multiple height cell placed on a plurality of rows having the same height as each other. The third cell C3' may include a hybrid height cell. As used herein, the terms "hybrid height cell" and "standard hybrid height cell" may refer to a cell that may be continuously placed on two or more adjacent rows having different heights (for example, CH1 and CH2) from each other, and may have a height equal to the first height CH1 added to the second height CH2. Terms such as "equal" or "same," as used herein encompass identicality or near identicality including variations that may occur, for example, due to manufacturing processes. The term "substantially" may be used herein to emphasize this meaning, unless the context or other statements indicate otherwise.

The integrated circuit 10" including mixed height blocks including rows having at least two different heights (for example, CH1 and CH2) from each other may include first and second cells C1" and C2" performing the same function. For example, the first cell C1" and the second cell C2" may be hybrid height cells continuously placed on two or more adjacent rows having different heights (for example, CH1 and CH2). The first cell C1" and the second cell C2" may each have a height equal to the first height CH1 added to the second height CH2. In an embodiment, the first cell C1" and the second cell C2" may perform the same function and have an identical height. However, the first power line and the second power line providing voltages to each cell of the first cell C1" and the second cell C2" may have different placement relations (different placement sequences of the first power line and the second power line).

Each of the integrated circuits 10, 10', and 10" may perform an identical function, but may include the plurality of standard cells having various layouts. For example, each of the integrated circuits 10, 10', and 10" may include different standard cells which perform an identical function, but have at least one different placement or shape of patterns of a via and a metal layout. A design method of the integrated circuits 10, 10', and 10" according to an example embodiment may selectively place, at proper locations, a standard cell that is advantageous from an aspect of an area size and a standard cell that is advantageous from an aspect of an operation, based on information about the standard cells performing an identical function while having various areas. Accordingly, an efficient design of the integrated circuits 10, 10', 10" may be made, and the integrated circuits 10, 10', 10" may be manufactured to have improved operation characteristics in a relatively small area.

Figure 2A:
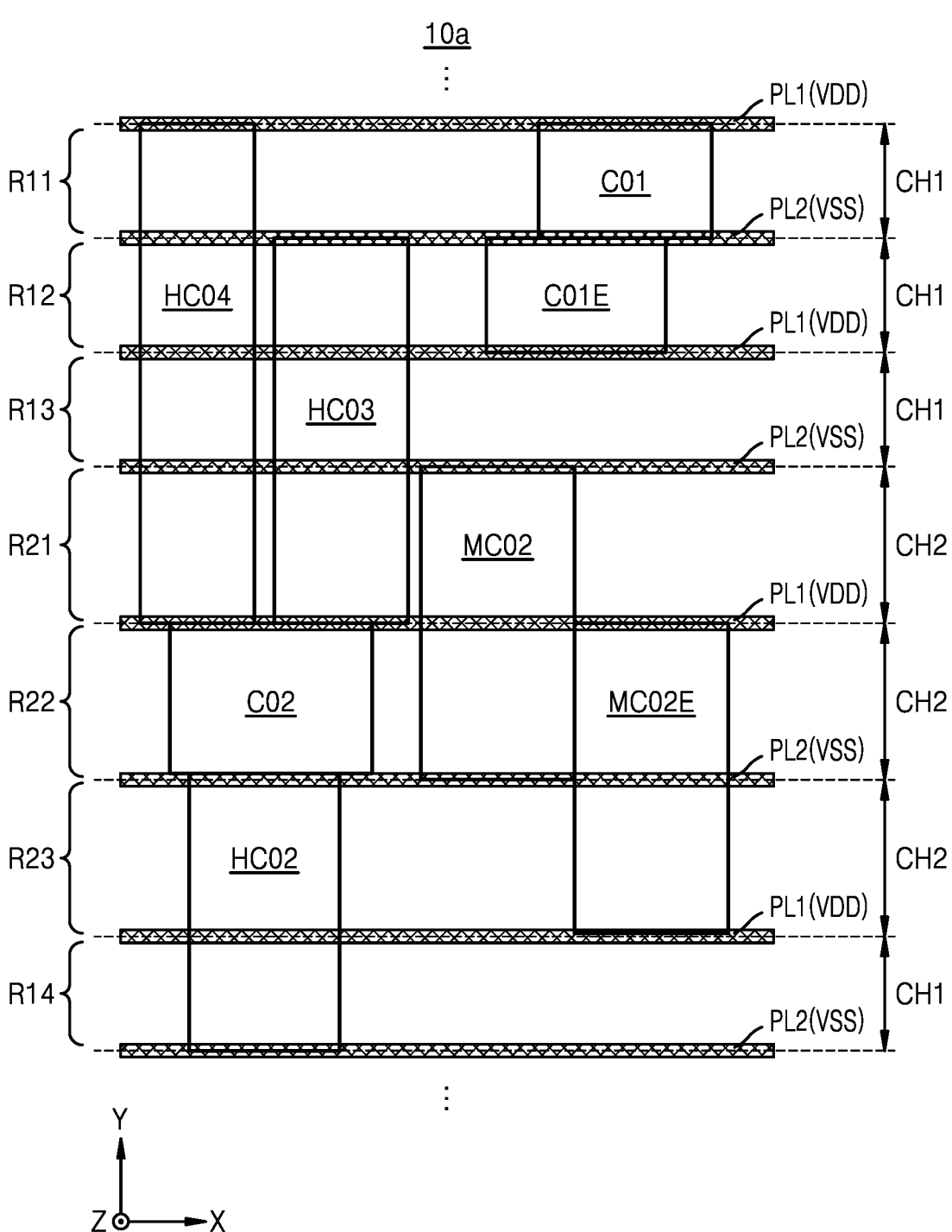
FIGS. 2A through 2C are diagrams of integrated circuits according to example embodiments.
Figure 2B:
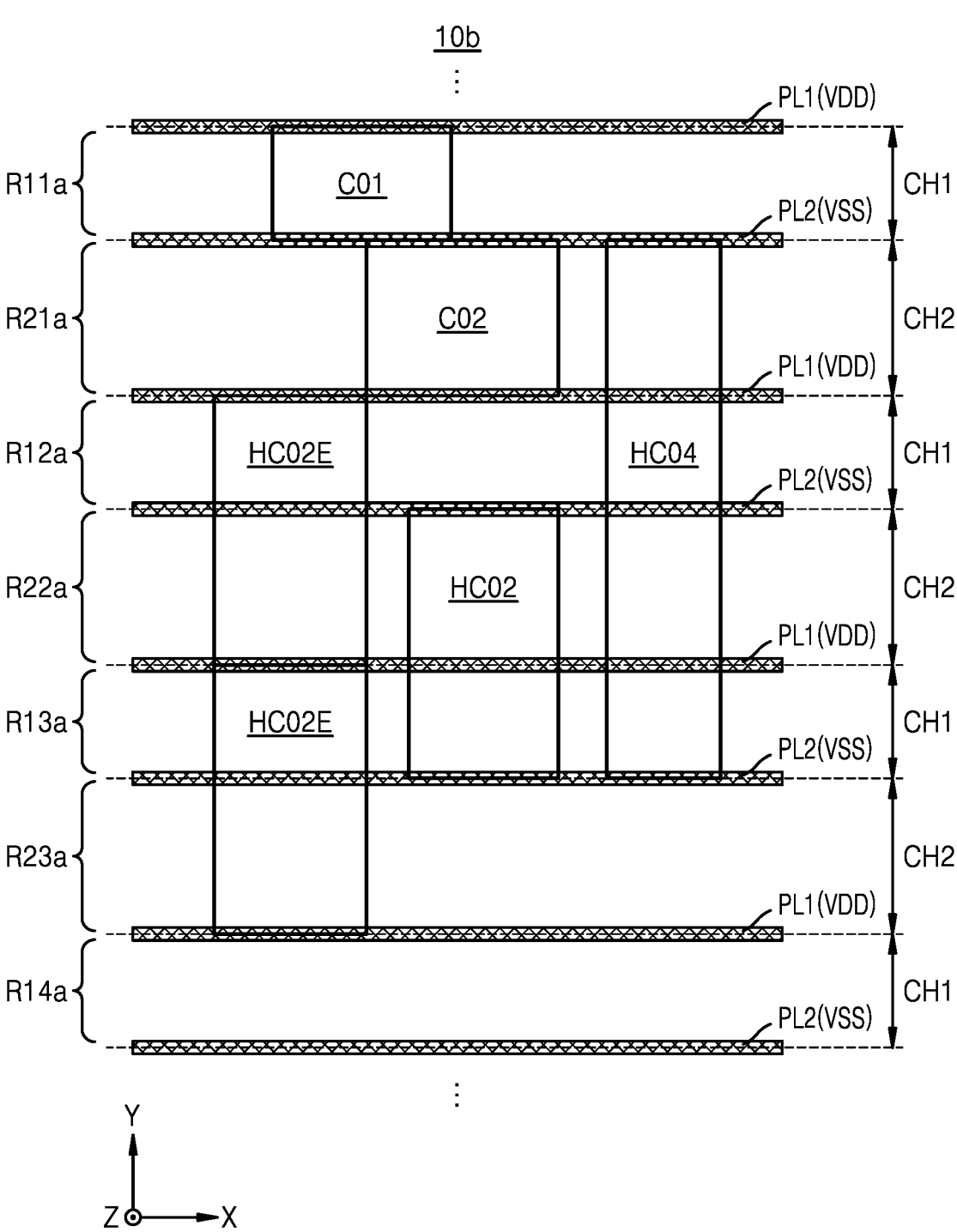
Figure 2C:
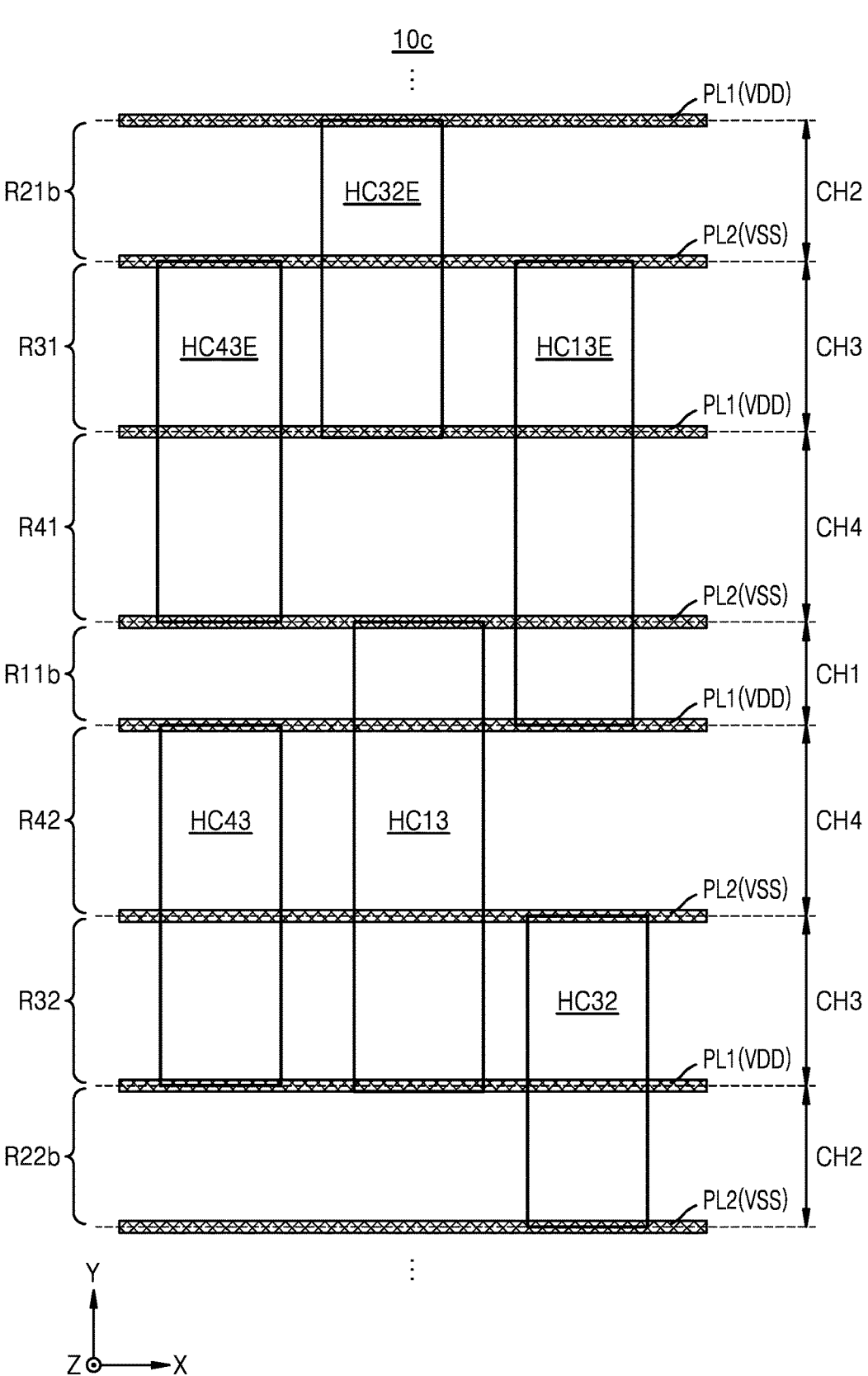

FIGS. 2A through 2C are diagrams of integrated circuits according to example embodiments. FIGS. 2A through 2C are plan views of portions of integrated circuits 10a, 10b, and 10c, respectively, constituting one chip or one function block on a plane including the X-axis and the Y-axis. The integrated circuits 10a, 10b, and 10c of FIGS. 2A through 2C, respectively, are detailed examples of the integrated circuits 10' and 10" including the mixed height block in FIG. 1.

On boundaries of each of the plurality of rows, a first power line PL1 to which a positive power voltage VDD is applied and a second power line PL2 to which a negative power voltage VSS (or a ground voltage) is applied may be formed. The first power line PL1 and the second power line PL2 may be formed by using a conductive pattern extending in the X-axis direction, and may be alternately placed in the Y-axis direction. For example, when the first power line PL1 is formed on one boundary of one row, the second power line PL2 may be formed on the other boundary thereof. Accordingly, the integrated circuits 10a, 10b, and 10c may include a plurality of power lines respectively formed on the plurality of rows. The plurality of power lines may comprise a first subset of the plurality of power lines (i.e., the plurality of first power lines PL1) and a second subset of the plurality of power lines (i.e., the plurality of second power lines PL2). The plurality of rows may comprise a first subset of the plurality of rows and a second subset of the plurality of rows.

Each of the plurality of power lines of the first subset of the plurality of power lines may be formed on a respective row of the first subset of the plurality of rows. Each of the plurality of power lines of the second subset of the plurality of power lines may be formed on a respective row of the second subset of the plurality of rows.

Referring to FIG. 2A, the integrated circuit 10a may include a plurality of standard cells C01, C01E, C02, MC02, MC02E, HC02, HC03, and HC04, which perform an identical function and are placed on a plurality of rows R11 through R14 and R21 through R23. The integrated circuit 10a may include first, second, third, and seventh rows R11, R12, R13, and R14, which have the first height CH1, and fourth, fifth, and sixth rows R21, R22, and R23, which have the second height CH2. In an embodiment, the second height CH2 may be greater than the first height H1.

In the integrated circuit 10a according to an example embodiment, a ratio of the number of rows having the first height CH1 over the number of rows having the second height CH2 may be about 3:3. In other words, three rows having the first height CH1 and three rows having the second height CH2 may be alternately placed. For example, a row having the second height CH2 may be disposed adjacent to the first row R11 along the Y-axis, and a row having the first height CH1 may be disposed adjacent to the seventh row R14 in a direction opposite to the Y-axis. However, the embodiment is not limited thereto, and a ratio of the number of rows having the first height CH1 over the number of rows having the second height CH2 may be set considering an area, performance, and power consumption of an integrated circuit. For example, M (M is a natural number greater than 0) rows having the first height CH1 and N (N is a natural number greater than 0) rows having the second height CH2 may be alternately placed.

The integrated circuit 10a may include single height cells C01 and C01E of the first height CH1, and a single height cell C02 of the second height CH2. In an embodiment, a first single height cell C01 of the first height CH1 and a second single height cell C01E of the first height CH1 may perform an identical function, but placement relations of power lines providing voltages to each cell may be different from each other. The first single height cell C01 may receive a voltage from the first power line PL1 and the second power line PL2, which are sequentially placed in a direction opposite to the Y-axis direction. The second single height cell C01E may receive a voltage from the second power line PL2 and the first power line PL1, which are sequentially placed in the direction opposite to the Y-axis direction. Internal conductive patterns of the first single height cell C01 and the second single height cell C01E may be formed different from each other. For example, in the first single height cell C01 and the second single height cell C01E, at least one of patterns of a contact, a via, and a metal layer may be formed different from another.

The integrated circuit 10a may include multiple height cells MC02 and MC02E having twice the second height CH2, as cells which are continuously placed on two or more adjacent rows having an identical height (for example, the second height CH2). A first multiple height cell MC02 and a second multiple height cell MC02E may perform an identical function, but placement relations of power lines providing voltages to each cell may be different from each other. The first multiple height cell MC02 may receive a voltage from the second power line PL2, the first power line PL1, and the second power line PL2, which are sequentially placed in the direction opposite to the Y-axis direction. The second multiple height cell MC02E may receive a voltage from the first power line PL1, the second power line PL2, and the first power line PL1, which are sequentially placed in the direction opposite to the Y-axis direction. Internal conductive patterns of the first multiple height cell MC02 and the second multiple height cell MC02E may be formed different from each other, and for example in, the first multiple height cell MC02 and the second multiple height cell MC02E, at least one of patterns of a contact, a via, and a metal layer may be formed different another.

In addition, in an embodiment, the integrated circuit 10$a$ may include at least one standard cell of a hybrid height (i.e., "standard hybrid height cell" or "hybrid height cell"). For example, a hybrid height cell HC04 placed across four rows including three rows, each of which having the first height CH1, and a row having the second height CH2, a hybrid height cell HC03 placed across three rows including two rows each of which having the first height CH1 and a row having the second height CH2, and a hybrid height cell HC02 placed across two rows including a row having the first height CH1 and a row having the second height CH2.

As discussed above, in FIG. 2A the integrated circuit 10$a$ may include a plurality of standard cells C01, C01E, C02, MC02, MC02E, HC02, HC03, and HC04. However, the integrated circuit 10$a$ according to aspects of the inventive concept is not limited thereto, and may further include a plurality of standard cells which perform an identical function and have varying heights, but have different internal conductive patterns from each other or different power line placements receiving voltages from each other.

Referring to FIG. 2B, the integrated circuit 10$b$ may include a plurality of standard cells C01, C02, HC02, HC02E, and HC04, which perform an identical function and are placed on a plurality of rows R11$a$ through R14$a$ and R21$a$ through R23$a$. The integrated circuit 10$b$ may include first, third, fifth, and seventh rows R11$a$, R12$a$, R13$a$, and R14$a$, which have the first height CH1, and second, fourth, and sixth rows R21$a$, R22$a$, and R23$a$, which have the second height CH2. In an embodiment, a row of the first height CH1 and a row of the second height CH2 may be alternately placed at a ratio of about 1:1. For example, a row having the second height CH2 may be disposed adjacent to the first row R11$a$ along the Y-axis, and a row having the first height CH2 may be disposed adjacent to the seventh row R14$a$ in a direction opposite to the Y-axis.

For example, the integrated circuit 10$b$ may include the standard cell (for example, C01) having the first height CH1, the standard cell (for example, C02) having the second height CH2, and standard cells (for example, HC02 and HC02E) having a height equal to the second height CH2 added to the first height CH1. In addition, the integrated circuit 10$b$ may include a standard cell (for example, HC04) having a height equal to twice the second height CH2 added to twice the first height CH1.

In an embodiment, a first hybrid height cell HC02 and a second hybrid height cell HC02E may each have a height equal to the second height CH2 added to the first height CH1 and may perform an identical function. With respect to each other, the first hybrid height cell HC02 and the second hybrid height cell HC02E may have different shapes of conductive patterns formed therein and different placement sequences of power lines through which each cell receives a voltage. The first hybrid height cell HC02 may receive a voltage from the second power line PL2, the first power line PL1, and the second power line PL2, which are sequentially placed in the direction opposite to the Y-axis direction. The second hybrid height cell HC02E may receive a voltage from the first power line PL1, the second power line PL2, and the first power line PL1, which are sequentially placed in the direction opposite to the Y-axis direction. As discussed above, in FIG. 2B the integrated circuit 10$b$ may include a plurality of standard cells C01, C02, HC02, HC02E, and HC04. However, the integrated circuit 10$b$ according to aspects of the inventive concept is not limited thereto, and may further include a plurality of standard cells which perform an identical function and have varying heights, but have different internal conductive patterns from each other or different power line placements receiving voltages from each other.

Referring to FIG. 2C, the integrated circuit 10$c$ may include a plurality of standard cells HC32E, HC43E, HC13E, HC13, HC43, and HC32, which perform an identical function, and are placed on a plurality of rows R21$b$, R31, R41, R11$b$, R42, R32, and R22$b$. In the integrated circuit 10$c$, the plurality of rows R21$b$, R31, R41, R11$b$, R42, R32, and R22$b$ may be placed to have one of the first through fourth heights CH1 through CH4. For example, a first row R21$b$ and a seventh row R22$b$ may have the second height CH2, a second row R31 and a sixth row R32 may have a third height CH3, a third row R41 and a fifth row R42 may have a fourth height CH4, and a fourth row R11$b$ may have the first height CH1. In an embodiment, the fourth height CH4 may be greater than the third height CH3, the third height CH3 may be greater than the second height CH2, and the second height CH2 may be greater than the first height CH1.

The integrated circuit 10$c$ may include standard cells (for example, HC32E and HC32) each having a height equal to the third height CH3 added to the second height CH2. In addition, the integrated circuit 10$c$ may include standard cells (for example, HC43E and HC43) each having a height equal to the fourth height CH4 added to the third height CH3. The integrated circuit 10$c$ may also include standard cells (for example, HC13E and HC13) each having a height equal to the first height CH1, the third height CH3, and the fourth height CH4 added together.

In an embodiment, a first hybrid height cell HC32 and a second hybrid height cell HC32E may each have a height equal to the second height CH2 is added to the third height CH3 and may perform an identical function. With respect to each other, the first hybrid height cell HC32 and the second hybrid height cell HC32E may have different shapes of conductive patterns formed therein and different placement sequences of power lines through which each cell receives a voltage. The first hybrid height cell HC32 may receive a voltage from the second power line PL2, the first power line PL1, and the second power line PL2, which are sequentially placed in the direction opposite to the Y-axis direction. The second hybrid height cell HC32E may receive a voltage from the first power line PL1, the second power line PL2, and the first power line PL1, which are sequentially placed in the direction opposite to the Y-axis direction.

In an embodiment, a first hybrid height cell HC43 and a second hybrid height cell HC43E may each have a height equal to the third height CH3 added to the fourth height CH4 and may perform an identical function. With respect to each other, the first hybrid height cell HC43 and the second hybrid height cell HC43E may have different shapes of conductive patterns formed therein and different placement sequences of power lines through which each cell receives a voltage. The first hybrid height cell HC43 may receive a voltage from the first power line PL1, the second power line PL2, and the first power line PL1, which are sequentially placed in the direction opposite to the Y-axis direction. The second hybrid height cell HC43E may receive a voltage from the second power line PL2, the first power line PL1, and the second power line PL2, which are sequentially placed in the direction opposite to the Y-axis direction.

In an embodiment, a first hybrid height cell HC13 and a second hybrid height cell HC13E may each have a height equal to the first height CH1, the third height CH3, and the fourth height CH4 added together and may perform an identical function. The first hybrid height cell HC13 and the second hybrid height cell HC13E may have different conductive patterns formed inside with respect to each other. As discussed above, in FIG. 2C the integrated circuit 10c may include a plurality of standard cells HC32E, HC43E, HC13E, HC13, HC43, and HC32. However, the integrated circuit 10c according to aspects of the inventive concept is not limited thereto, and may further include a plurality of standard cells which perform an identical function and have varying heights, but have different internal conductive patterns from each other or different power line placements receiving voltages from each other.

As described with reference to FIGS. 2A through 2C, the integrated circuits 10, 10b, and 10c may perform an identical function, but may include a plurality of standard cells having various layouts. A design method of the integrated circuits 10a, 10b, and 10c according to an example embodiment may selectively place, at proper locations, standard cells that are advantageous from an aspect of an area size and a standard cell that is advantageous from an aspect of an operation, based on information about the standard cells performing an identical function while having various areas.

Figure 3:
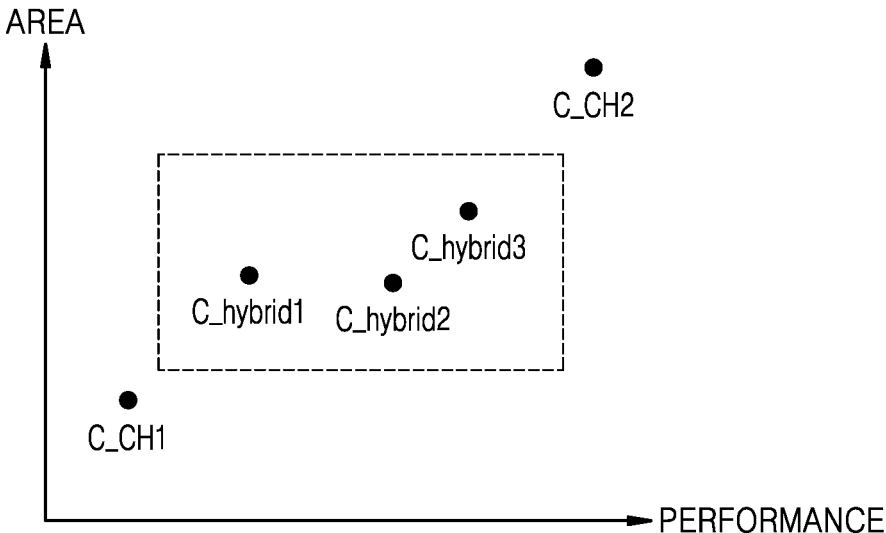
FIG. 3 is a diagram for describing degrees of integration and performance according to heights of standard cells included in an integrated circuit, according to an example embodiment.

FIG. 3 is a diagram for describing degrees of integration and performance according to heights of standard cells included in an integrated circuit, according to an example embodiment.

Referring to FIG. 3, a plurality of standard cells which have different areas and layouts from each other while performing an identical function may be defined. For example, cells C_CH2 having the second height CH2 of the standard cells performing an identical function may have lower density, higher performance, and greater power consumption, compared to cells C_CH1 having the first height CH1. On the other hand, the cells C_CH1 having the first height CH1 of the standard cells performing an identical function may have higher density, lower performance, and less power consumption, compared to the cells C_CH2 having the second height CH2. In other words, as a height of a standard cell is increased, density may be decreased, performance may be improved, and power consumption may be increased. For example, when rows having the first through fourth heights CH1 through CH4 are formed as illustrated in the integrated circuit 10b described with reference to FIG. 2C, a single height cell having the first height CH1 may be referred to as an ultra-high density cell, a single height cell having the second height CH2 may be referred to as a high density cell, a single height cell having the third height CH3 may be referred to as a high speed cell, and a single height cell having the fourth height CH4 may be referred to as an ultra-high speed cell.

In the case of an integrated circuit in which hybrid height cells C_hybrid1, C_hybrid2, and C_hybrid3 are placed on rows having different heights, compared to an integrated circuit in which only single height cells or multiple height cells placed on rows having an identical height, an available range of density and an available range of performance may vary. A method of designing an integrated circuit according to the inventive concept may select and place standard cells of a plurality of standard cells performing an identical function and having various layouts, according to conditions required by the integrated circuit (for example, a size of the integrated circuit, performance of the integrated circuit, or power consumption of the integrated circuit). Accordingly, performance and a degree of integration of an integrated circuit may be optimized.

Figure 4:
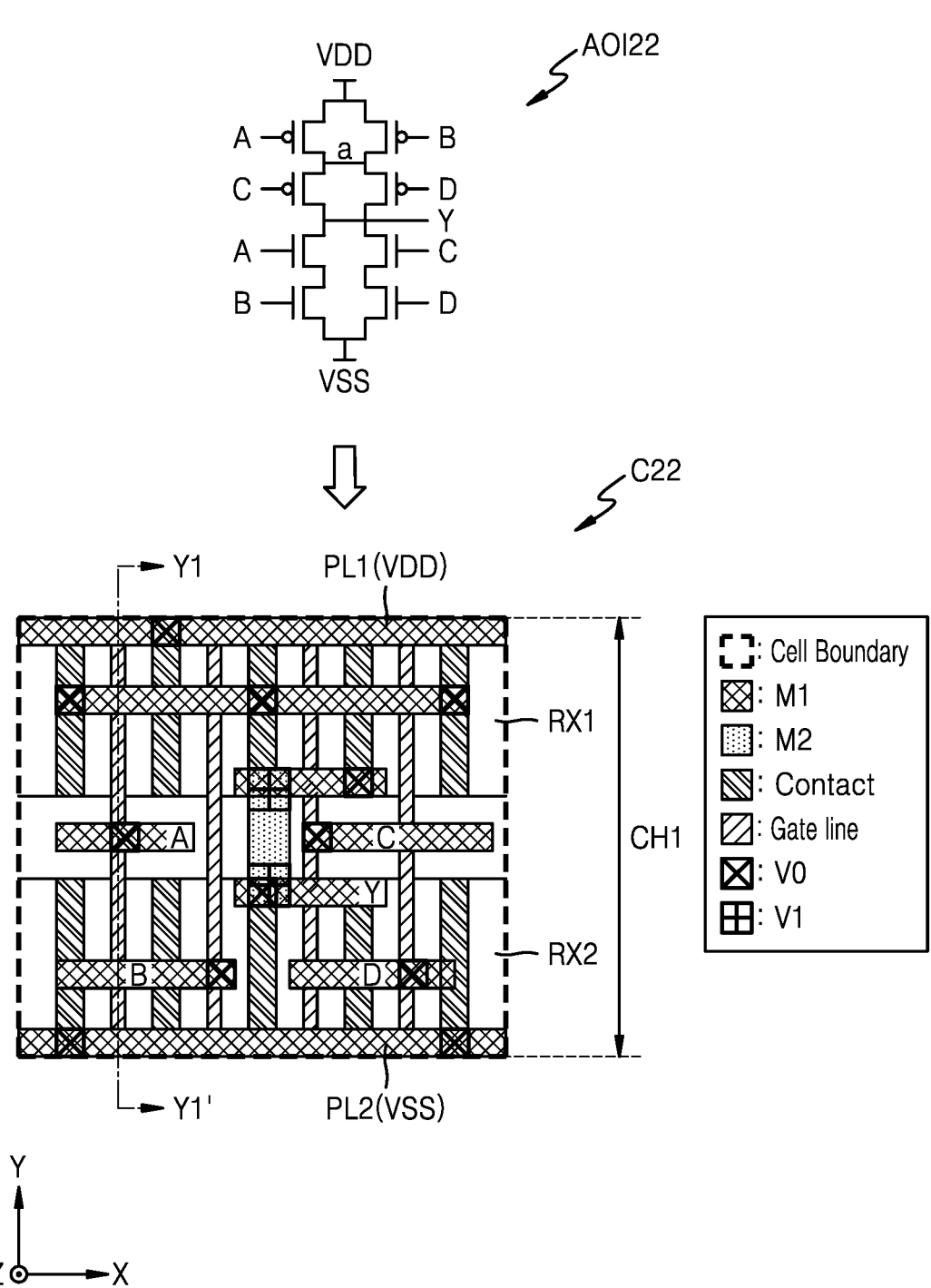
FIGS. 4 through 7 are plan views of standard cells of various layouts included in an integrated circuit, according to example embodiments.

FIGS. 4 through 7 are plan views of standard cells of various layouts included in an integrated circuit, according to example embodiments. FIGS. 4 through 7 are examples, for convenience of description, of layouts of standard cells in which a 2-2 AND-OR-inverter (AO122) circuit is implemented. The upper portion of FIG. 4 illustrates a circuit diagram of the AO122 circuit, and the lower portion of FIG. 4 schematically illustrates layouts of a standard cell C22 corresponding to the AO122 circuit on a plane including the X-axis and the Y-axis. FIGS. 4 through 7 are diagrams of standard cells which perform an identical function but have different layouts from each other, and the integrated circuit according to the inventive concept may include standard cells in which particular circuits except the AO122 circuit are implemented and various layouts are used.

In the diagrams of the inventive concept, only some layers may be illustrated for convenience of illustration, and a via may be illustrated even though being under a pattern to show a connection of a pattern of a wiring layer to a lower pattern.

Standard cells C22, MC22, HC22, and HC22E illustrated in FIGS. 4 through 7 may be defined by cell boundaries. Each of a first active region RX1 and a second active region RX2 formed in the standard cells C22, MC22, HC22, and HC22E may extend in the X-axis direction, and an active pattern formed in each of the first active region RX1 and a second active region RX2 may be crossed with a gate line extending in the Y-axis direction to form a transistor. A p-type transistor may be formed in the first active region RX1, and an n-type transistor may be formed in the second active region RX2.

Pitches between the gate lines included in the standard cells C22, MC22, HC22, and HC22E may be identical. Accordingly, at least some of the gate lines of the standard cells C22, MC22, HC22, and HC22E may be placed and aligned in the Y-axis direction.

On the first active region RX1 and the second active region RX2, at least one fin extending in the X-axis direction may be formed, or a nanowire or a nanosheet may be formed. Accordingly, the gate line and an active region may form a fin field effect transistor (FET) (FinFET). Embodiments of the inventive concept will be described with reference to cells including the FinFET, but it should be understood that the embodiments may be applied to cells including transistors of a structure different from the FinFET. Shapes of active patterns formed in the first active region RX1 and the second active region RX2 will be described in detail with reference to FIGS. 8A and 8B, respectively.

In an embodiment, the first active region RX1 and the second active region RX2 may include a semiconductor such as Si and Ge, or a compound semiconductor such as SiGe, GaAs, InAs, and InP, and may also include a conductive region, for example, a well doped with impurities, and a structure doped with impurities. In an embodiment, the gate line may include a work function metal-containing layer and a gap-fill metal layer. For example, the work function metal-containing layer may include at least one of Ti, W, Ru, Nb, Mo, Hf, Ni, Co, Pt, Yb, Tb, Dy, Er, and Pd, and the gap-fill metal layer may include a W layer or an Al layer. In an embodiment, the gate lines may include a stacked structure of TiAlC/TiN/W, a stacked structure of TiN/TaN/TiAlC/TiN/W, or a stacked structure of TiN/TaN/TiN/TiAlC/TiN/W.

The standard cells C22, MC22, HC22, and HC22E may include metal layers stacked in the Z-axis direction, for example, a first metal layer M1 and a second metal layer M2. In an embodiment, a width of a pattern formed on the second metal layer M2 may be greater than a width of a pattern on the first metal layer M1, but the embodiment is not limited thereto.

Patterns formed on the first metal layer M1 and the second metal layer M2 may include a metal, conductive metal nitride, metal silicide, or a combination thereof. For example, patterns formed on the first metal layer M1, the second metal layer M2, and a third metal layer M3 may include conductive materials such as tungsten (W), molybdenum (Mo), titanium (Ti), cobalt (Co), tantalum (Ta), nickel (Ni), tungsten silicide, titanium silicide, cobalt silicide, tantalum silicide, and nickel silicide.

The standard cells C22, MC22, HC22, and HC22E may include first vias V0 electrically connecting the first active region RX1, the second active region RX2, and the gate line to the pattern of the first metal layer M1. In addition, the standard cells C22, MC22, HC22, and HC22E may include the pattern formed on the first metal layer M1 and the pattern formed on the second metal layer M2, and may include a second via V1 connecting the first metal layer M1 to the second metal layer M2 between the first metal layer M1 and the second metal layer M2.

An integrated circuit may include the first power line PL1 extending in the X-axis direction and configured to receive a positive power voltage VDD and the second power line PL2 configured to receive a negative power voltage VSS (or a ground voltage), and the standard cells C22, MC22, HC22, and HC22E may receive a voltage from at least one first power line PL1 and at least one second power line PL2. In FIGS. 4 through 7, an example in which the first power line PL1 and the second power line PL2 are formed by the pattern on the first metal layer M1 is illustrated, but the integrated circuit according to the inventive concept is not limited thereto, and the first power line PL1 and the second power line PL2 may be formed by using the pattern of the second metal layer M2, or may be formed as a buried type in a substrate.

Referring to FIG. 4, first, second, third, and fourth input signals A, B, C, and D may be input to the AO122 circuit, and an output signal Y may be output from the AO122 circuit. The AO122 circuit may include four n-type FETs and four p-type FETs. According to a function of the AO122 circuit, when at least one signal of the first input signal A and the second input signal B is logic low, and at least one signal of the third input signal C and the fourth input signal D is logic low, the AO122 circuit may output the output signal Y of logic high.

The standard cell C22 may include input pins to which the first, second, third, and fourth input signals A, B, C, and D are input, and output pins from which the output signal Y is output. The standard cell C22 may be a standard cell and have the first height CH1. The standard cell C22 may receive a voltage from the first power line PL1 and the second power line PL2, which are sequentially placed in the direction opposite to the Y-axis direction. The integrated circuit according to the inventive concept may have the same height and perform the same function as the standard cell C22, and may include a standard cell receiving a voltage from the second power line PL2 and the first power line PL1, which are sequentially placed in the direction opposite to the Y-axis direction.

Figure 5:
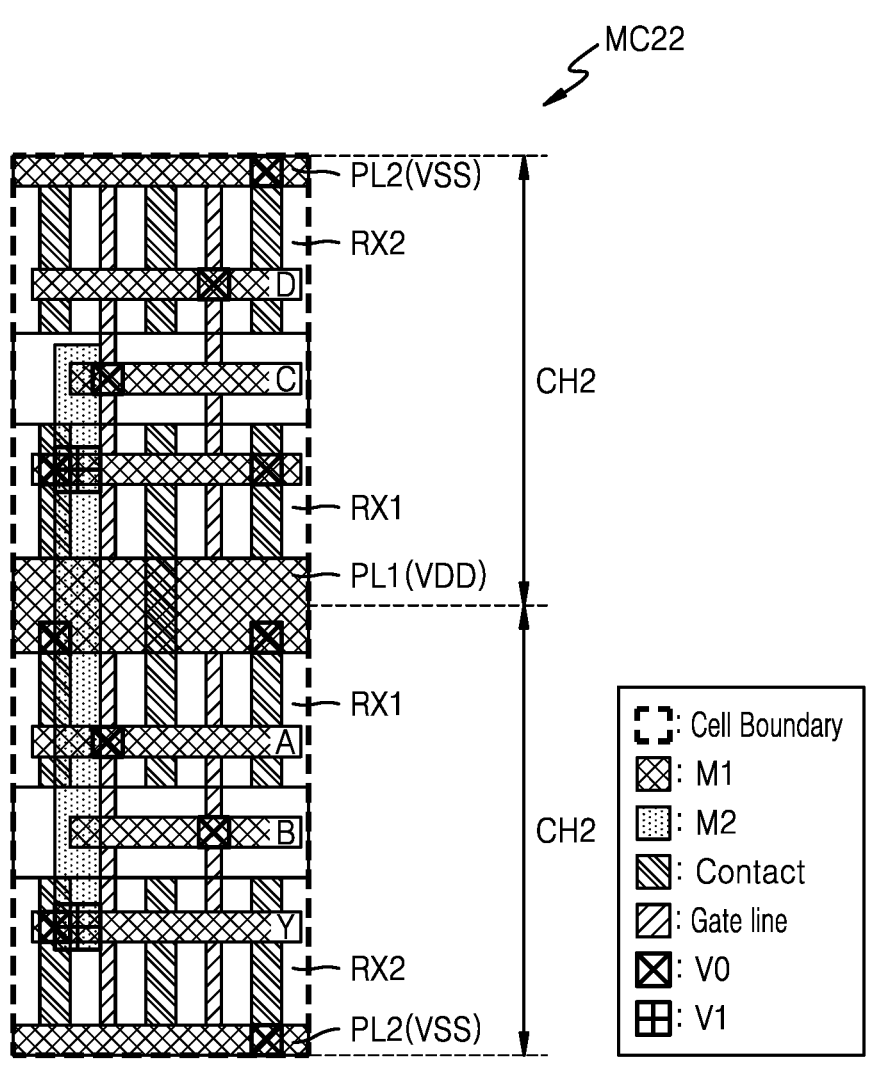
Figure 5:
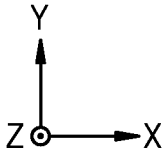

Referring to FIG. 5, a standard cell MC22 may be a multiple height cell, and may be placed on a plurality of rows having an identical height. For example, the standard cell MC22 may be placed on a first row of the second height CH2 and a second row of the second height CH2, and have a height of twice the second height CH2.

The standard cell MC22 may receive a voltage from the second power line PL2, the first power line PL1, and the second power line PL2, which are sequentially placed in the direction opposite to the Y-axis direction. The integrated circuit according to the inventive concept may have the same height and perform the same function as the standard cell MC22, and may include a standard cell receiving a voltage from the first power line PL1, the second power line PL2, and the first power line PL1, which are sequentially placed in the direction opposite to the Y-axis direction.

Figure 6:
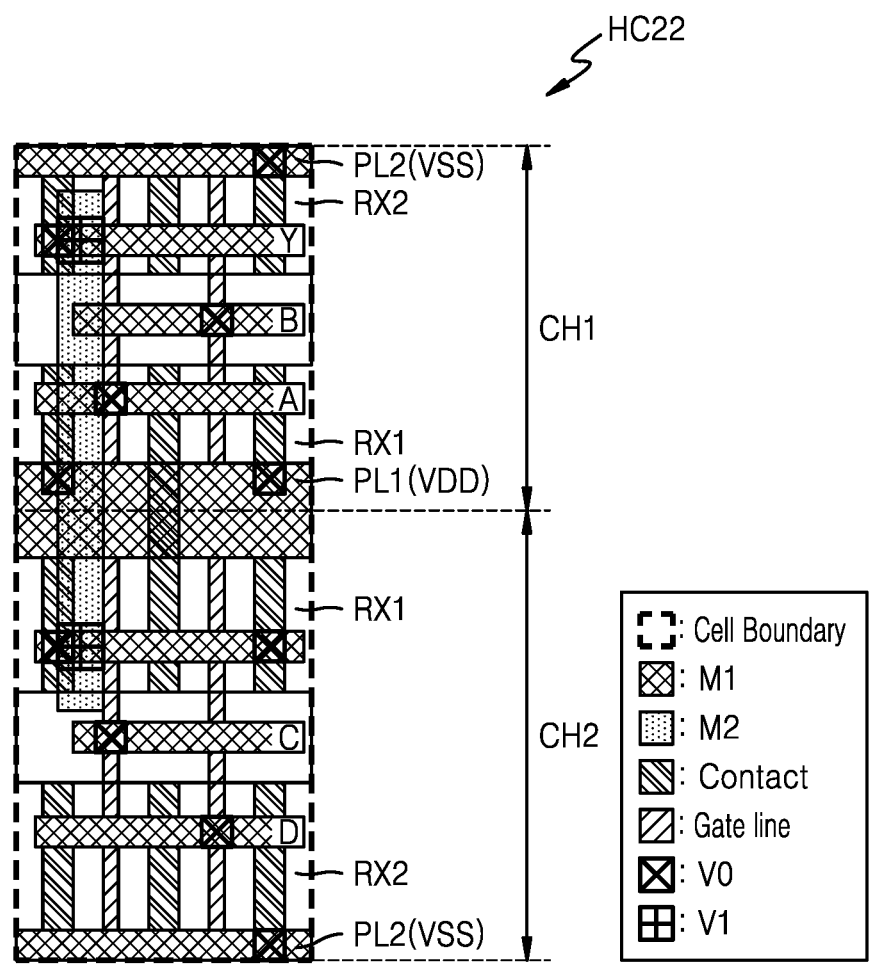
Figure 6:
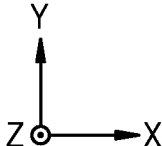

Referring to FIG. 6, a standard cell HC22 may be a hybrid height cell, and may be placed on a plurality of rows having different heights. For example, the standard cell HC22 may be placed on a first row of the first height CH1 and a second row of the second height CH2, and may have a height equal to the first height CH1 added to the second height CH2. The standard cell HC22 may receive a voltage from the second power line PL2-the first power line PL1-the second power line PL2, which are sequentially placed in the direction opposite to the Y-axis direction. The integrated circuit according to the inventive concept may have the same height and perform the same function as the standard cell HC22, but may also include the standard cells placed on a first row of the second height CH2 and a second row of the first height CH1.

Figure 7:
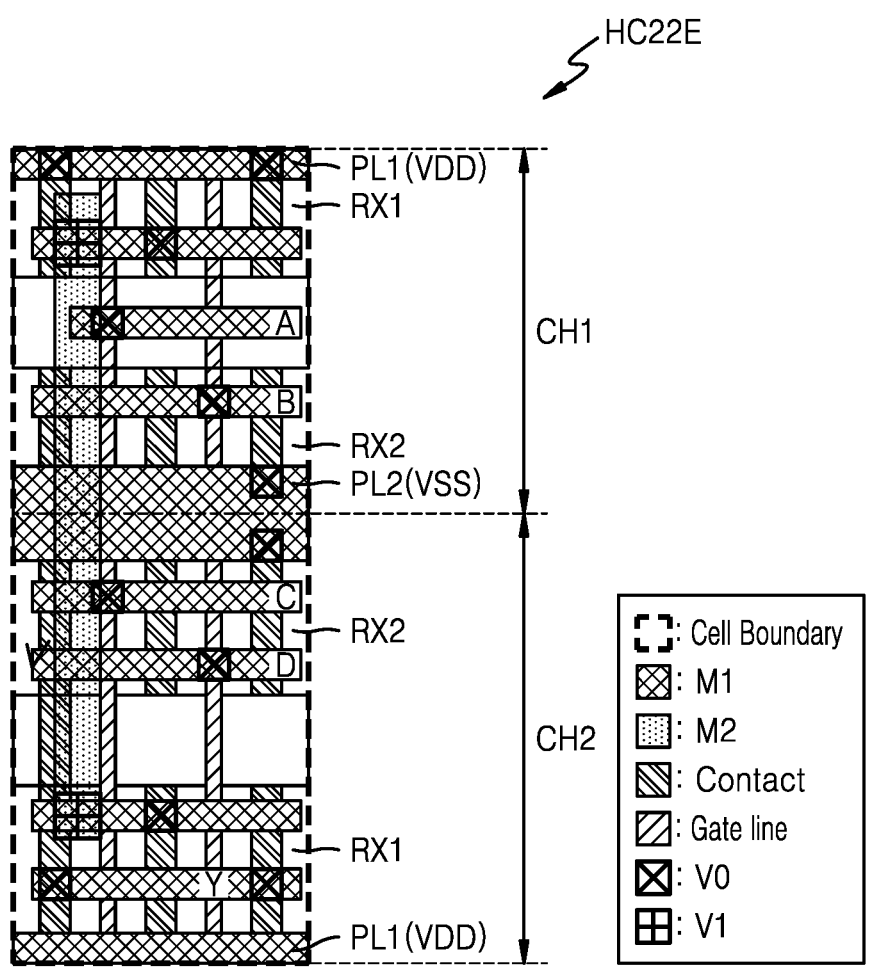
Figure 7:
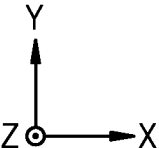

Referring to FIG. 7, a standard cell HC22E may be a hybrid height cell, and may be placed on a plurality of rows having different heights. For example, the standard cell HC22E may be placed on a first row of the first height CH1 and a second row of the second height CH2, and may have a height equal to the first height CH1 added to the second height CH2. The standard cell HC22E may receive a voltage from the first power line PL1, the second power line PL2, and the first power line PL1, which are sequentially placed in the direction opposite to the Y-axis direction. The standard cell HC22 of FIG. 6 and the standard cell HC22E of FIG. 7 may have an identical height and perform an identical function to each other, but may have different placement sequences of the power lines providing a voltage to each cell. In addition, the integrated circuit according to the inventive concept may have the same height and perform the same function as the standard cell HC22E, but may also include a first row of the second height CH2 and a second row of the first height CH1.

Figure 8A:
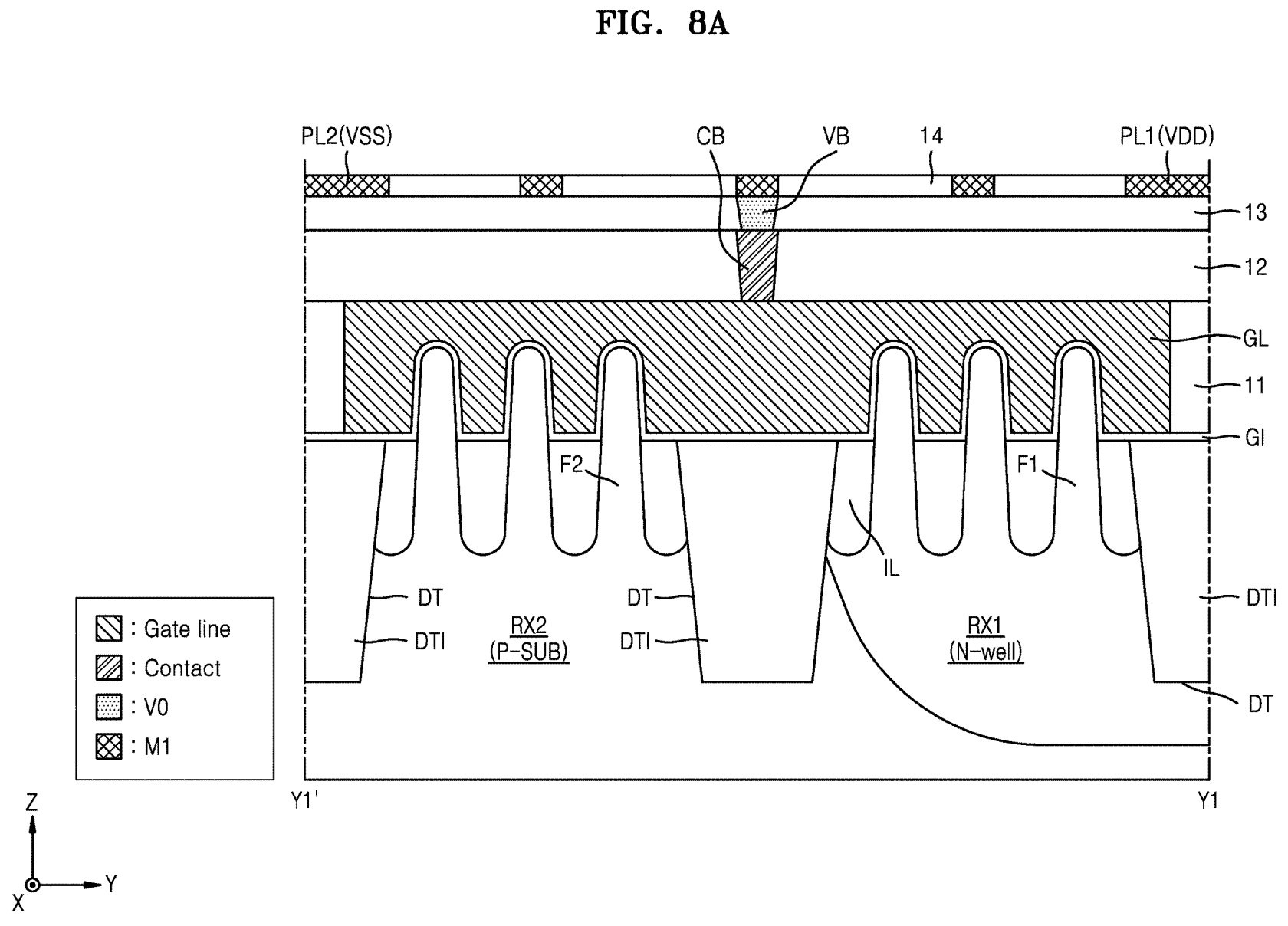
Figure 8B:
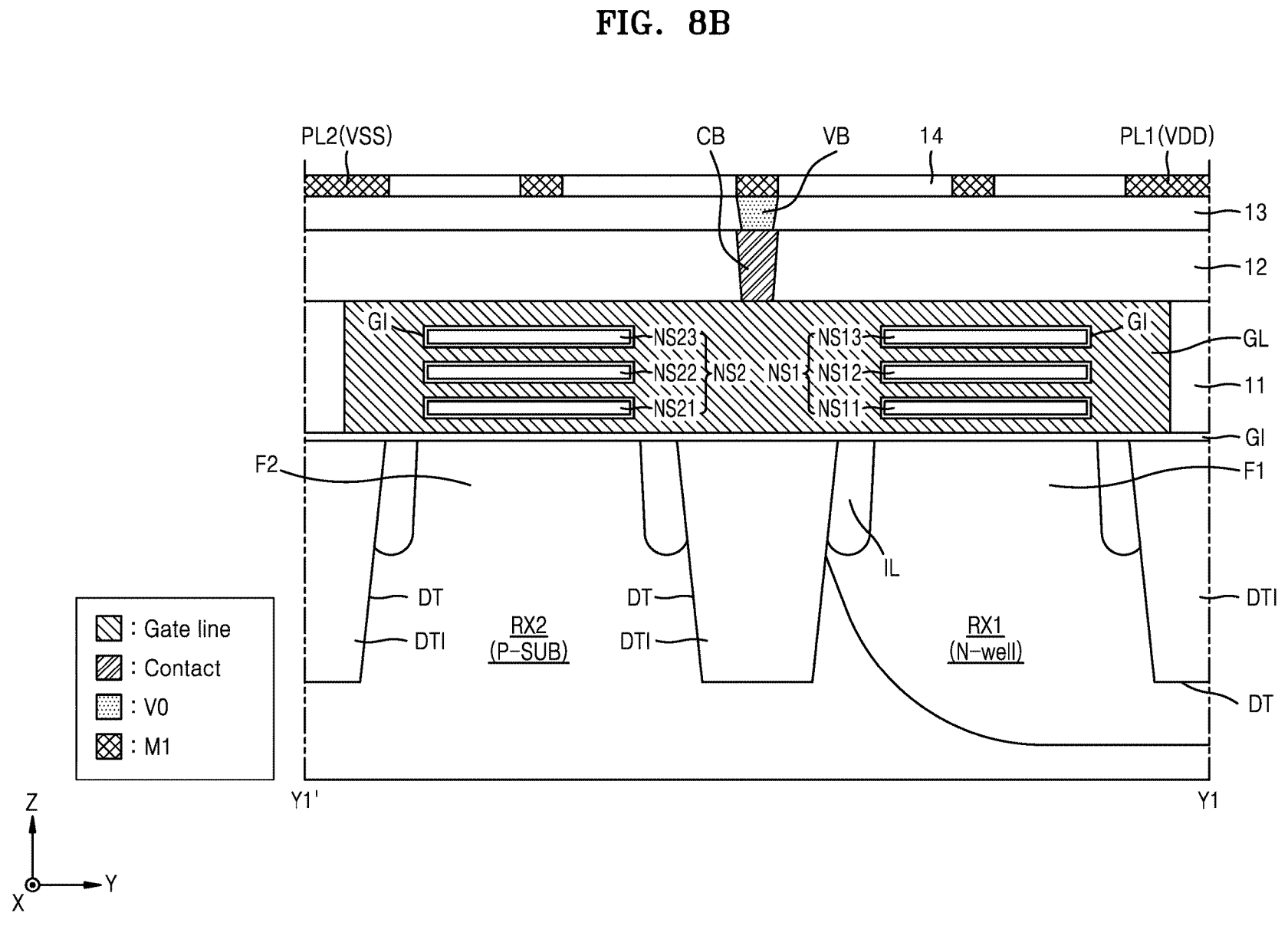

FIGS. 8A and 8B are cross-sectional views of standard cells included in an integrated circuit, according to example embodiments, which are cross-sectional views taken along line Y1-Y1' in FIG. 4. FIG. 8A illustrates an example in which a plurality of fins are formed in an active region, and FIG. 8B illustrates an example in which nanosheets are formed in an active region. However, a standard cell included in an integrated circuit according to the inventive concept is not limited to those illustrated in FIGS. 8A and 8B. For example, in a standard cell, a gate-all-around (GAA) FET in which a gate line is surrounded by a nanowire formed in an active region may be formed, and a plurality of nanowires may be vertically stacked in the active region and a vertical GAA FET in which the plurality of nanowires are surrounded by the gate line may be formed. For example, in the standard cell, a multi bridge channel (MBC) FET in which the plurality of nanosheets are stacked in the active region and the gate line surrounds the plurality of nanosheets may be formed. In addition, for example, a negative capacitance (NC) FET may be formed in the active region. In addition to examples of transistors described above, various transistors such as complementary FET (CFET), negative CFET (NCFET), carbon nanotube (CNT) FET, bipolar junction transistor, and three-dimensional transistor may be formed on the gate line and in the active region.

Referring to FIG. 8A, the first active region RX1 and the second active region RX2 may be formed on a substrate P-SUB. In an embodiment, the second active region RX2 may be formed in the substrate P-SUB doped with p-type impurities, and the first active region RX1 may be formed in an N-well formed in the substrate P-SUB.

The substrate P-SUB may include a semiconductor material such silicon, germanium, and silicon-germanium, or a Group III-V compound such as GaAs, AlGaAs, InAs, InGaAs, InSb, GaSb, InGaSb, InP, GaP, InGaP, InN, GaN, and InGaN. In an embodiment, the substrate P-SUB may include a silicon-on-insulator (SOI) substrate or a germanium-on-insulator (GOI) substrate. In an embodiment, the substrate P-SUB may be doped with p-type impurities.

An isolation trench DT may be formed between the first active region RX1 and the second active region RX2 in the Y-axis direction. A device isolation layer DTI may be formed by filling insulating material (for example, an oxide) inside the isolation trench DT. The first active region RX1 and the second active region RX2 may be set apart from each other by the device isolation layer DTI. Below the first power line PL1 and the second power line PL2 in the Z-direction, the isolation trench DT may be formed and the device isolation layer DTI may also be formed.

A plurality of first fins F1 and a plurality of second fins F2 may extend in parallel with each other in the X-axis direction. An insulating layer IL (for example, an oxide) may be formed between the plurality of first fins F1 and between the plurality of second fins F2. The plurality of first fins F1 and a plurality of second fins F2 may protrude in a fin shape over the insulating layer IL in the first active region RX1 and the second active region RX2. In FIG. 8A, it is illustrated that three first fins F1 and three second fins F2 are formed, but the embodiment is not limited thereto, and the number of fins formed in the first active region RX1 and the second active region RX2 may be variously changed.

A gate insulator GI and a gate line GL may be formed to extend in the Y-axis direction. The gate insulator GI and the gate line GL may cover an upper surface and both side walls of each of the plurality of first fins F1 and the plurality of second fins F2, an upper surface of the insulating layer IL, and an upper surface of the device isolation layer DTI.

First through fourth interlayer insulating layers 11 through 14 may be formed on the plurality of first fins F1 and the plurality of second fins F2. A source/drain contact and a source/drain via connecting a source/drain region to the pattern of the first metal layer M1 by penetrating the first interlayer insulating layer 11 may be formed.

A gate contact CB may penetrate the second interlayer insulating layer 12 and may be connected to the gate line GL. A first via V0 (e.g., gate via VB), may penetrate a third interlayer insulating layer 13 and be connected to the gate contact CB and the pattern of the first metal layer M1 (for example, an input pin to which the first input signal A is input). Accordingly, the pattern of the first metal layer M1 may be electrically connected to the gate line GL via the gate via VB and the gate contact CB.

Referring to FIG. 8B, in an embodiment, a nanosheet, or an active region, may be formed over each of the first active region RX1 and the second active region RX2. A first nanosheet stack NS1 may be formed over the first active region RX1, and a second nanosheet stack NS2 may be formed over the second active region RX2. Each of the first nanosheet stack NS1 and the second nanosheet stack NS2 may extend in the X-axis direction.

Each of the first nanosheet stack NS1 and the second nanosheet stack NS2 may function as a channel of a transistor. For example, the first nanosheet stack NS1 may be doped with n-type impurities, and may form a p-type transistor. On the other hand, the second nanosheet stack NS2 may be doped with p-type impurities, and may form an n-type transistor. In an embodiment, the first nanosheet stack NS1 and the second nanosheet stack NS2 may include Si, Ge, or SiGe. In an embodiment, the first nanosheet stack NS1 and the second nanosheet stack NS2 may include InGaAs, InAs, GaSb, or InSb, or a combination thereof.

Each of the first nanosheet stack NS1 and the second nanosheet stack NS2 may include a plurality of nanosheets NS11 through NS13 and NS21 through NS23, which overlap each other in the vertical direction (Z direction) over the first fins F1 and the second fins F2. In the present example, the case in which each of the first nanosheet stack NS1 and the second nanosheet stack NS2 includes three nanosheets is illustrated, but the embodiment is not limited thereto. For example, each of the first nanosheet stack NS1 and the second nanosheet stack NS2 may include at least two nanosheets, but the number of nanosheets is not particularly limited.

The gate line GL may cover the first nanosheet stack NS1 and the second nanosheet stack NS2 over the first fin F1 and the second fin F2, and may surround each of the plurality of nanosheets NS11 through NS13 and NS21 through NS23. The plurality of nanosheets NS11 through NS13 and NS21 through NS23 may have a GAA structure surrounded by the gate line GL. The gate insulator GI may be placed between the first and second nanosheet stacks NS1 and NS2 and the gate line GL. For example, the gate insulator GI may surround each of the plurality of nanosheets NS11 through NS13 and NS21 through NS23.

Figure 9:
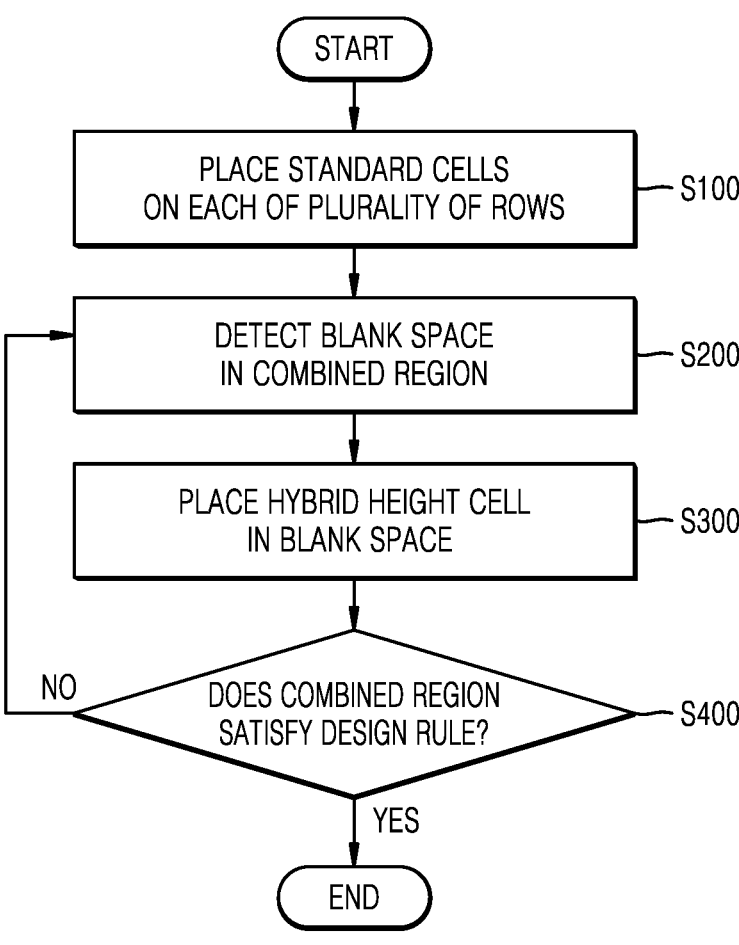
FIGS. 9 and 10 are flowcharts of a method of designing an integrated circuit, according to example embodiments.
Figure 10:
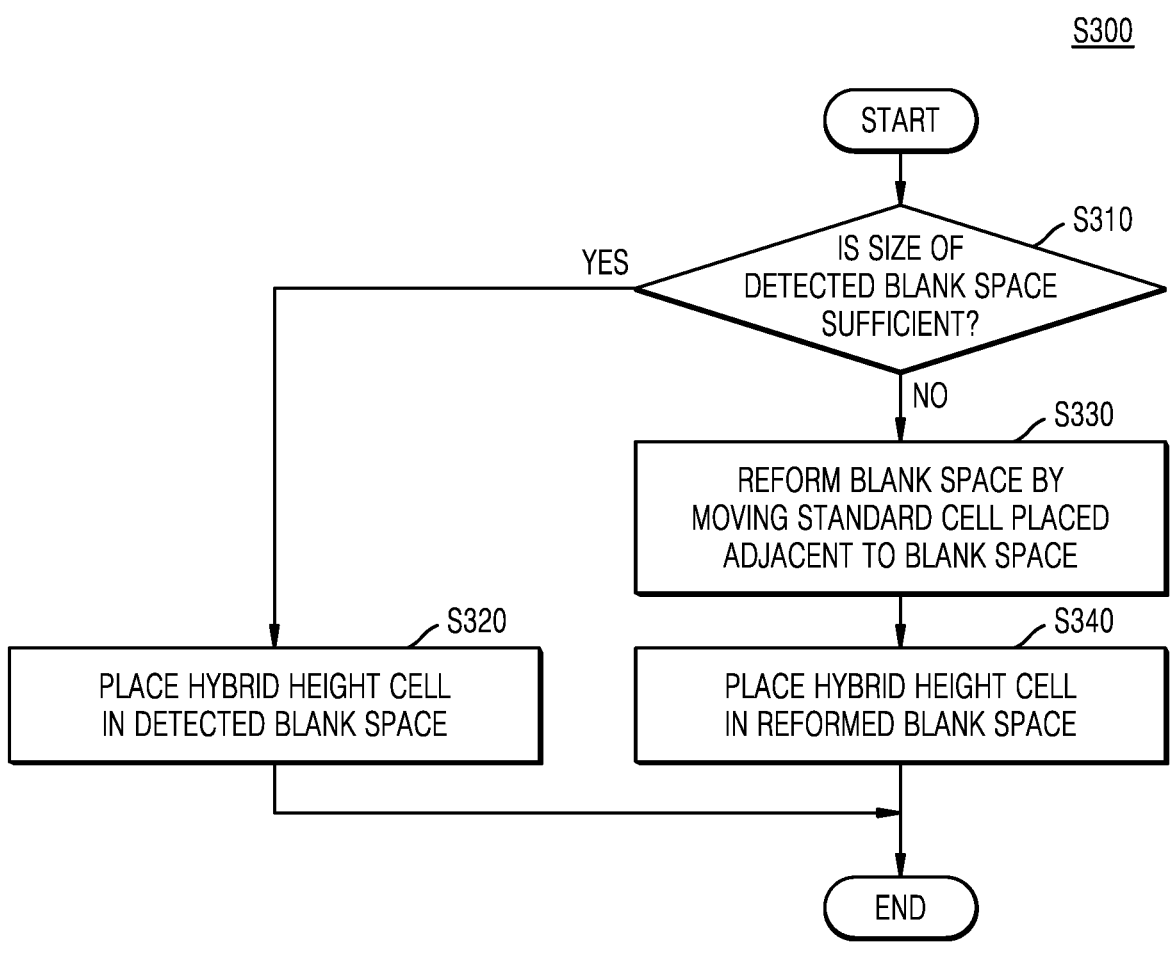

FIGS. 9 and 10 are flowcharts of a method of designing an integrated circuit, according to example embodiments. FIGS. 9 and 10 are flowcharts of a method of designing an integrated circuit which includes rows having at least two different heights from each other, and includes a hybrid height cell placed on the rows.

Referring to FIG. 9, the method of designing the integrated circuit according to the inventive concept may include operations S100 through S400. Standard cells including function cells may be placed on each of a plurality of rows (S100). On each of the plurality of rows, single height cells may be placed, or multiple height cells may also be placed.

The function cell may be a standard cell in which logic elements (for example, an inverter, a flip-flop, a logic gate, or the like) in correspondence to the function cell are formed. The placed standard cells may include filler cells. The filler cell may be placed adjacent to the function cell, and include a cell providing routing of signals, which are provided to the function cell or output from the function cell, and in addition, the filler cell may include a cell used to fill a remaining space after the function cells are placed.

A blank (i.e., empty) space may be detected in a combined region (S200). When a height of a particular row is different from a height of a row adjacent thereto, the particular row and the adjacent row may be included in the combined region. In this case, the blank space may be referred to as a region where the function cell is not placed, for example, a region where a dummy cell, such as a filler cell is placed.

Referring to FIGS. 9 and 10, the hybrid height cell may be placed in the detected blank space (S300). Operation S300 may include operations S310 through S340. Whether a size of the detected blank space is sufficient may be determined (S310), which may mean determining whether the size of the detected blank space is sufficient so that the hybrid height cell may be placed to satisfy operation characteristic requirements of an integrated circuit required in designing the integrated circuit. When the size of the detected blank space is determined to be sufficient, the hybrid height cell may be placed in the detected blank space (S320).

When the size of the detected blank space is determined to be insufficient, the detected blank space may be reformed by moving a standard cell placed adjacent to the detected blank space (S330). The reformed blank space may be formed having a width in the X-direction that is greater than a width in the X-direction of the detected blank space. The hybrid height cell may be placed in the reformed blank space (S340). In an embodiment, as the hybrid height cell is placed, another standard cell which performs the same function as the hybrid height cell but has a different layout from the hybrid height cell may be removed. For example, the removed standard cell may be swapped with the hybrid height cell.

Referring to FIG. 9 again, whether the combined region satisfies a design rule may be determined (S400). For example, when a ratio of remaining blank space in the combined region is greater than a ratio of blank space in the entire integrated circuit, operation S200 may be performed again to reduce the size of the remaining blank space in the combined region. In addition, in an embodiment, whether the placed standard cells satisfy performance requirements, power requirements, and density requirements may be determined (S400), and when these requirements are not satisfied, operation S200 may be performed again.

A design method of an integrated circuit according to the inventive concept may optimize performance and a degree of integration of the integrated circuit, by arranging not only a single height cell but a multiple height cell on rows having an identical height, and arranging hybrid height cells on rows having different heights from each other.

Figure 11A:
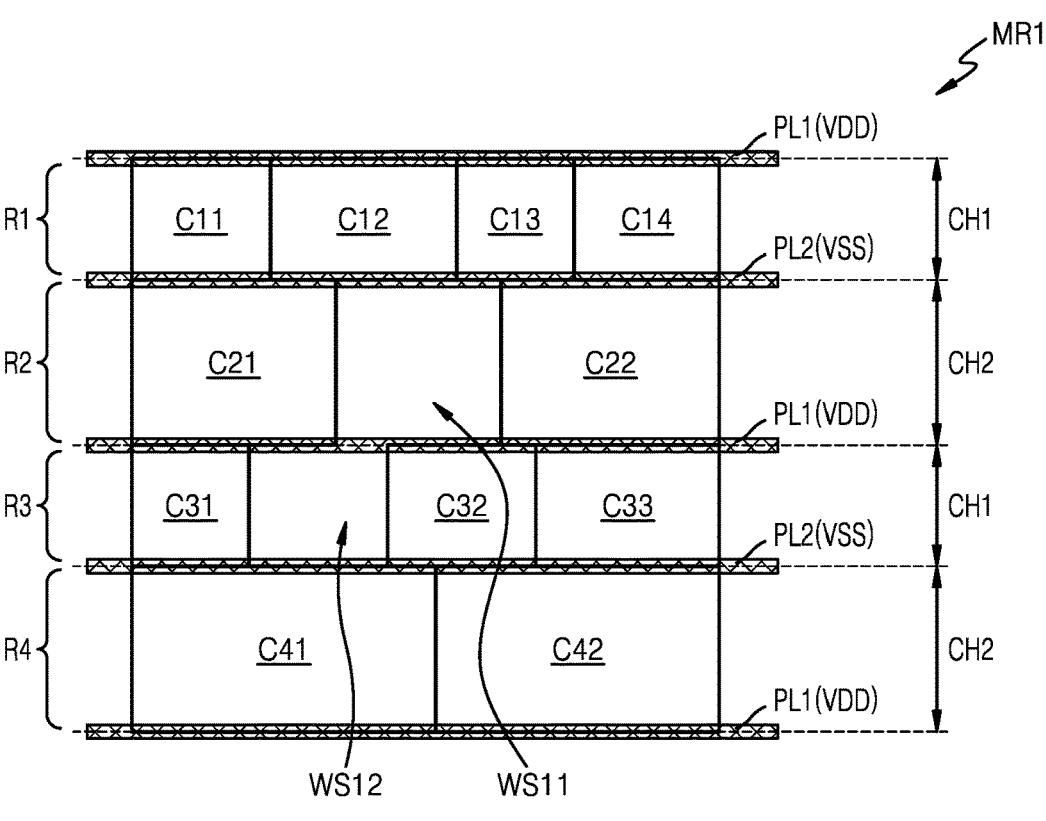
FIGS. 11A through 11C are diagrams for describing a method of designing an integrated circuit, according to example embodiments.
Figure 11A:
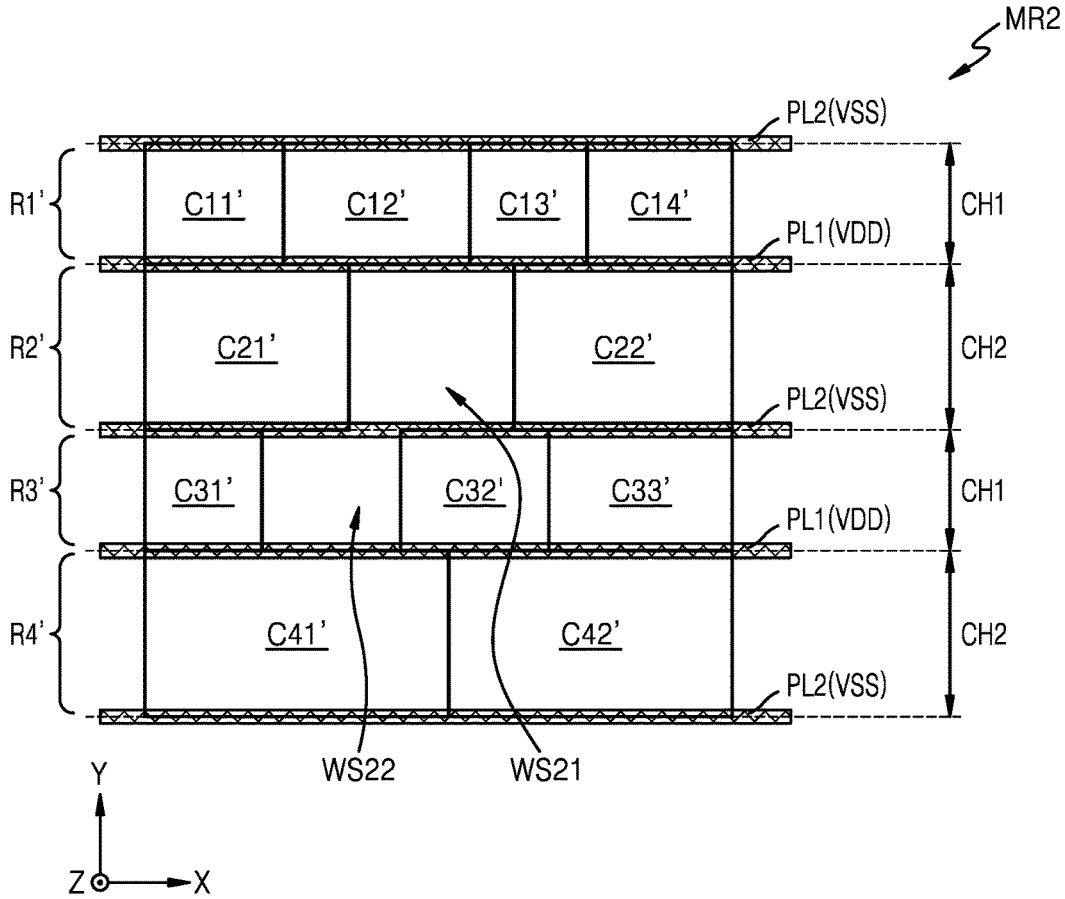
Figure 11B:
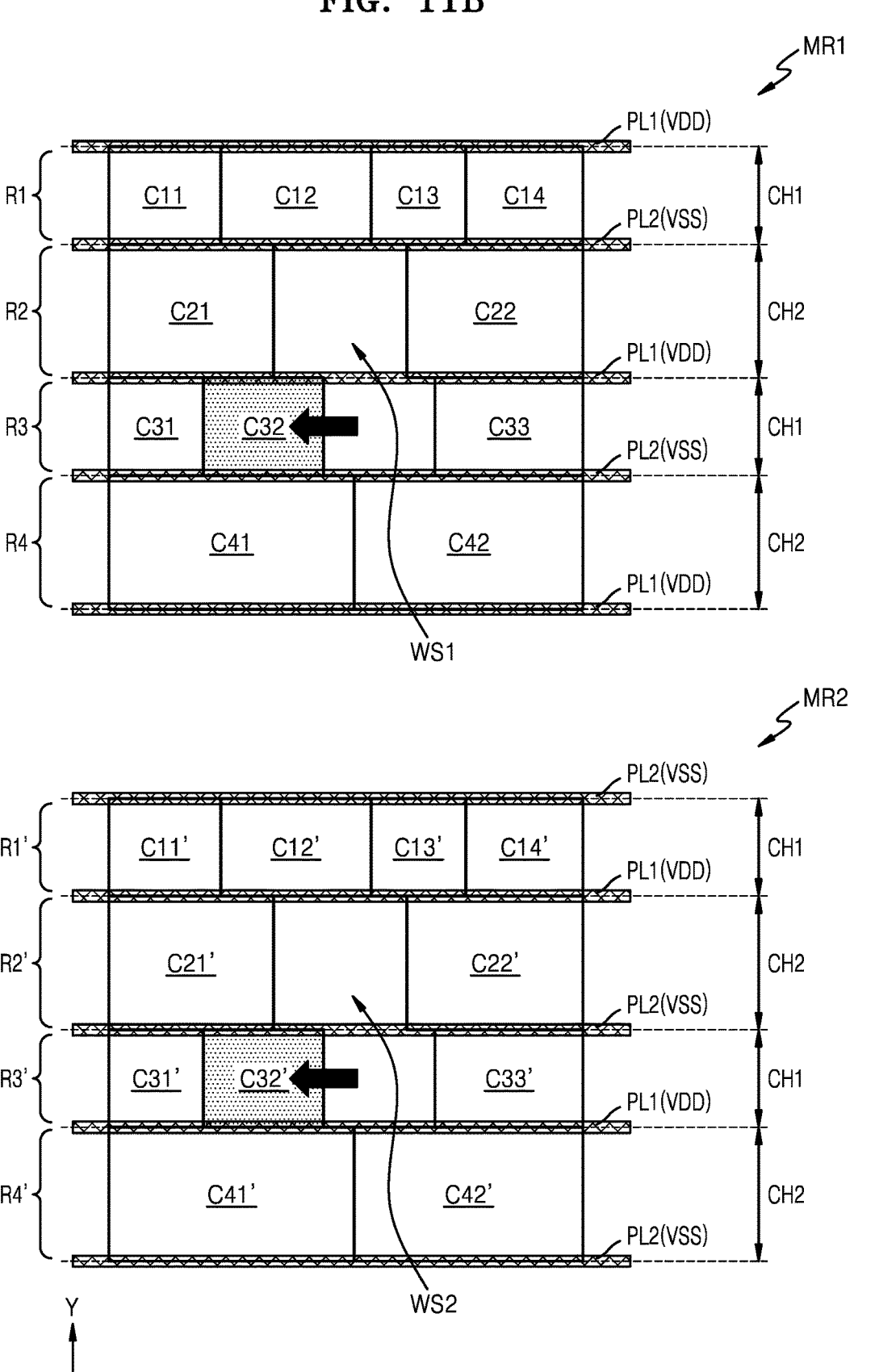
Figure 11C:
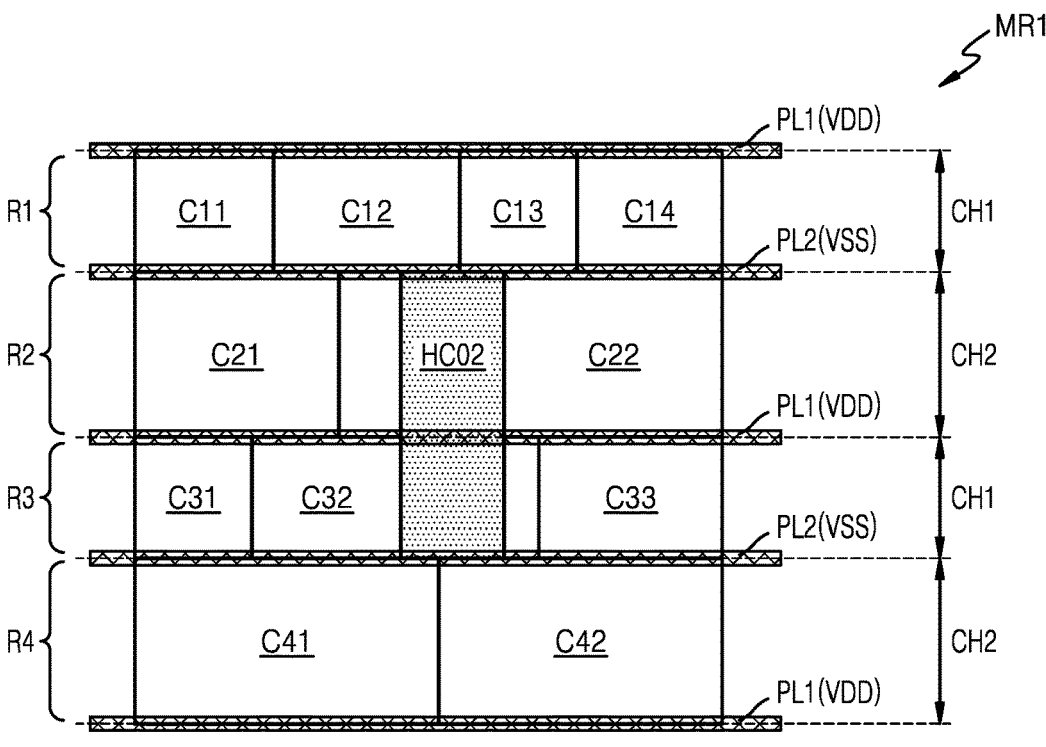
Figure 11C:
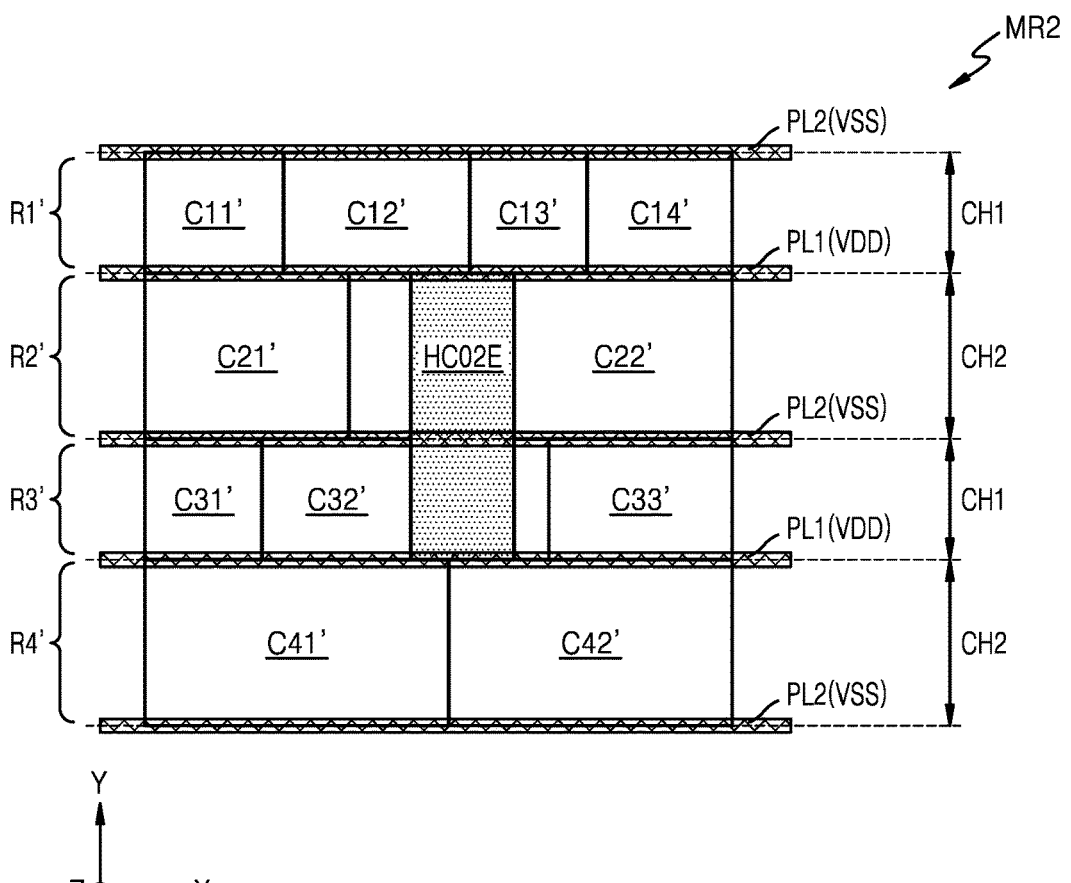

FIGS. 11A through 11C are diagrams for describing a method of designing an integrated circuit, according to example embodiments. FIGS. 11A through 11C are plan views for describing operations S200 and S300 in FIGS. 9 and 10.

Referring to FIG. 11A, a first combined region MR1 of an integrated circuit may include first through fourth rows R1 through R4 in the direction opposite to the Y-axis direction. The first row R1 and the third row R3 may have the first height CH1, and the second row R2 and the fourth row R4 each respectively adjacent to the first row R1 and the third row R3 may have the second height CH2 that is greater than the first height CH1. Function cells C11 through C14, C21, C22, C31 through C33, C41, and C42 may be placed on the first through fourth rows R1 through R4.

In the first combined region MR1, a first blank space WS11 of the second row R2 and a second blank space WS12 of the third row R3 may be formed at locations where the function cells C11 through C14, C21, C22, C31 through C33, C41, and C42 are not placed. As operation S200 in FIG. 9 is performed, the first blank space WS11 and the second blank space WS12 may be detected. The first blank space WS11 may be located between the second power line PL2 and the first power line PL1, which are sequentially placed in the direction opposite to the Y-axis direction, and the second blank space WS12 may be located between the first power line PL1 and the second power line PL2, which are sequentially placed in the direction opposite to the Y-axis direction.

A second combined region MR2 of the integrated circuit may include first through fourth rows R1' through R4', which are sequentially placed in the direction opposite to the Y-axis direction. The first row R1' and the third row R3' may have the first height CH1, and the second row R2' and the fourth row R4' each respectively adjacent to the first row R1' and the third row R3' may have the second height CH2 that is greater than the first height CH1. Function cells C11' through C14', C21', C22', C31' through C33', C41', and C42' may be placed on the first through fourth rows R1' through R4'.

In the second combined region MR2, a first blank space WS21 of the second row R2' and a second blank space WS22 of the third row R3' may be formed at locations where the function cells C11' through C14', C21', C22', C31' through C33', C41', and C42' are not placed. As operation S200 in FIG. 9 is performed, the first blank space WS21 and the second blank space WS22 may be detected. The first blank space WS21 may be located between the first power line PL1 and the second power line PL2, which are sequentially placed in the direction opposite to the Y-axis direction, and the second blank space WS22 may be located between the second power line PL2 and the first power line PL1, which are sequentially placed in the direction opposite to the Y-axis direction.

Referring to FIGS. 11A and 11B, as operation S330 in FIG. 10 is performed to increase a size of a blank space in the first combined region MR1, a standard cell C32 of the third row R3 of the standard cells placed adjacent to the first blank space WS11 and the second blank space WS12 may be moved, and the second blank space WS12 may be reformed to form a blank space WS1. For example, standard cell C32 may be moved so as to occupy at least a part of second blank space WS12 and to vacate at least a portion of space below first blank space WS11 such that the second blank space WS12 is reformed to form blank space WS1. On the blank space WS1, the second power line PL2, the first power line PL1, and the second power line PL2 may be sequentially formed in the direction opposite to the Y-axis direction.

In addition, as operation S330 in FIG. 10 is performed to increase a size of a blank space in the second combined region MR2, a standard cell C32' of the third row R3' of the standard cells placed adjacent to the first blank space WS21 and the second blank space WS22 may be moved, and the second blank space WS22 may be reformed to form a blank space WS2. For example, standard cell C32' may be moved so as to occupy at least a part of second blank space WS22 and to vacate at least a portion of space below first blank space WS21 such that the second blank space WS22 is reformed to form blank space WS2. On the blank space WS2, the first power line PL1, the second power line PL2, and the first power line PL1 may be sequentially formed.

Referring to FIGS. 11B and 11C, as operation S340 in FIG. 10 is performed, the first hybrid height cell HC02 may be sequentially placed on the second row R2 and the third row R3 in the blank space WS1 of the first combined region MR1. The first hybrid height cell HC02 may have a height equal to the second height CH2 added to the first height CH1.

On the other hand, as operation S340 in FIG. 10 is performed, the second hybrid height cell HC02E may be sequentially placed on the second row R2' and the third row R3' in the blank space WS2 of the second combined region MR2. The second hybrid height cell HC02E may have a height equal to the second height CH2 added to the first height CH1.

In an embodiment, the first hybrid height cell HC02 and the second hybrid height cell HC02E may perform an identical function. However, with respect to each other, the first hybrid height cell HC02 and the second hybrid height cell HC02E may have different shapes of conductive patterns formed therein and may have different placement sequences of power lines via which each cell receives a voltage. The first hybrid height cell HC02 may receive a voltage from the second power line PL2, the first power line PL1, and the second power line PL2, which are sequentially placed in the direction opposite to the Y-axis direction. On the other hand, the second hybrid height cell HC02E may receive a voltage from the first power line PL1, the second power line PL2, and the first power line PL1, which are sequentially placed in the direction opposite to the Y-axis direction.

A design method of an integrated circuit according to aspects of the inventive concept may select and place proper hybrid height cells according to a placement sequence, in placement of the hybrid height cell in a blank space. For example, according to a comparative example in which only the first hybrid height cell HC02 may be placed, because the first hybrid height cell HC02 may not be placed in the second combined region MR2, there may be a difficulty to separately secure a blank space to place the first hybrid height cell HC02. Accordingly, the design method of the integrated circuit according to the inventive concept may make it possible to design an efficient integrated circuit and manufacture the integrated circuit to have improved operation characteristics in a relatively small area.

Figure 12:
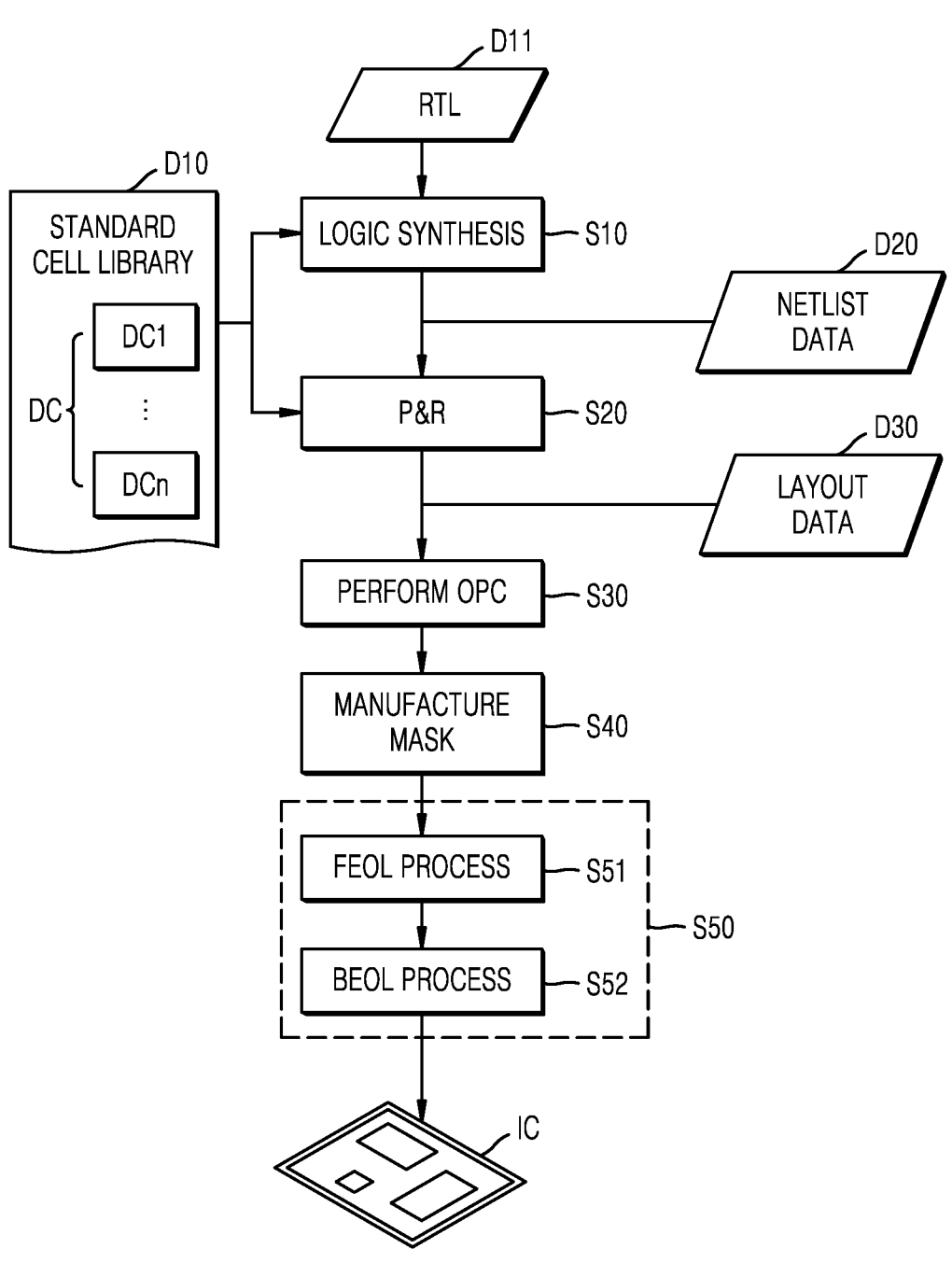
FIG. 12 is a flowchart of a method of manufacturing an integrated circuit (IC), according to an example embodiment.

FIG. 12 is a flowchart of a method of manufacturing an integrated circuit IC, according to an example embodiment.

Referring to FIG. 12, a standard cell library D10 may include information about standard cells, for example, function information, characteristic information, layout information, etc. of the standard cells. The standard cell library D10 may include data DC defining layout information of the standard cells. The data DC may also include data which identifies a function performed by each of the standard cells and data which defines a structure of standard cells, such as the standard cells described with reference to FIGS. 1 through 11C. The standard cell library D10 may include data DC1 through DCn (n is a natural number equal to or greater than two) which identifies the function and defines the layout and structure (e.g., internal conductive patterns, sequences of power lines each providing a voltage to each cell, etc.) of the standard cells.

A logic synthesis operation of generating netlist data D20 from register-transfer level (RTL) data D11 may be performed (S10). For example, a semiconductor design tool (for example, a logic synthesis module) may generate the netlist data D20 including a bitstream or a netlist, by performing a logic synthesis by referring to the standard cell library D10 on the RTL data D11 which is created in hardware description language (HDL) such as very-high-speed IC (VHSIC) HDL (VHDL) and Verilog. In the logic synthesis operation, the standard cells may be included in the integrated circuit IC by referring to such information in the standard cell library D10.

A place & routing (P&R) operation generating layout data D30 from the netlist data D20 may be performed (S20). The layout data D30 may have a format of, for example, graphic database system information interchange (GDSII), and may include geometric information about the standard cells and the interconnections.

For example, the semiconductor design tool (for example, the P&R module) may place a plurality of standard cells by referring to the standard cell library D10 from the netlist data D20. The semiconductor design tool may, by referring to the data DC, select one of layouts of the standard cell defined by the netlist data D20, and place the selected layout of the standard cell. For example, operation S20 may include operations S100 through S400 in FIG. 9, and may include operations S310 through S340 in FIG. 10.

An operation of generating interconnections may be further performed (S20). The interconnection may electrically connect an output pin of a standard cell to an input pin thereof, and for example, may include at least one via and at least one conductive pattern.

Optical proximity correction (OPC) may be performed (S30). The OPC may be referred to as an operation of forming a pattern of a desired shape by correcting distortion such as refraction caused by characteristics of light in photolithography included in a semiconductor process for manufacturing the integrated circuit IC, and the pattern on a mask may be determined by applying the OPC to the layout data D30. In some embodiments, the layout of the integrated circuit may be limitedly modified in operation S30, and the limited modification of the integrated circuit IC in operation S30 may be a post process for optimizing the structure of the integrated circuit IC, which may be referred to as design polishing.

An operation of manufacturing a mask may be performed (S40). For example, as the OPC is applied to the layout data D30, patterns on the mask may be defined to form patterns formed on a plurality of layers, and at least one mask (or, photomask) for forming the pattern of each of the plurality of layers may be manufactured.

An operation of fabricating the integrated circuit IC may be performed (S50). For example, the integrated circuit IC may be fabricated by patterning the plurality of layers by using at least one mask manufactured in operation S40. Operation S50 may include operations S51 and S52.

A front-end-of-line (FEOL) process may be performed (S51). The FEOL process may be referred to as a process of forming individual devices, such as transistors, capacitors, and resistors on a substrate in the manufacturing process of the integrated circuit IC. For example, the FEOL process may include planarizing and cleaning a wafer, forming a trench, forming a well, forming a gate line, forming a source and a drain, etc.

A back-end-of-line (BEOL) process may be performed (S52). The BEOL process may be referred to as a process of interconnecting individual devices, such as transistors, capacitors, and resistors, in the manufacturing process of the integrated circuit IC. For example, the BEOL process may include silicidating a gate, a source, and drain regions, adding dielectric, planarizing, forming holes, adding metal layers, forming vias, and forming passivation layers, etc. Next, the integrated circuit IC may be packaged in a semiconductor package, and used as a component of various applications.

Figure 13:
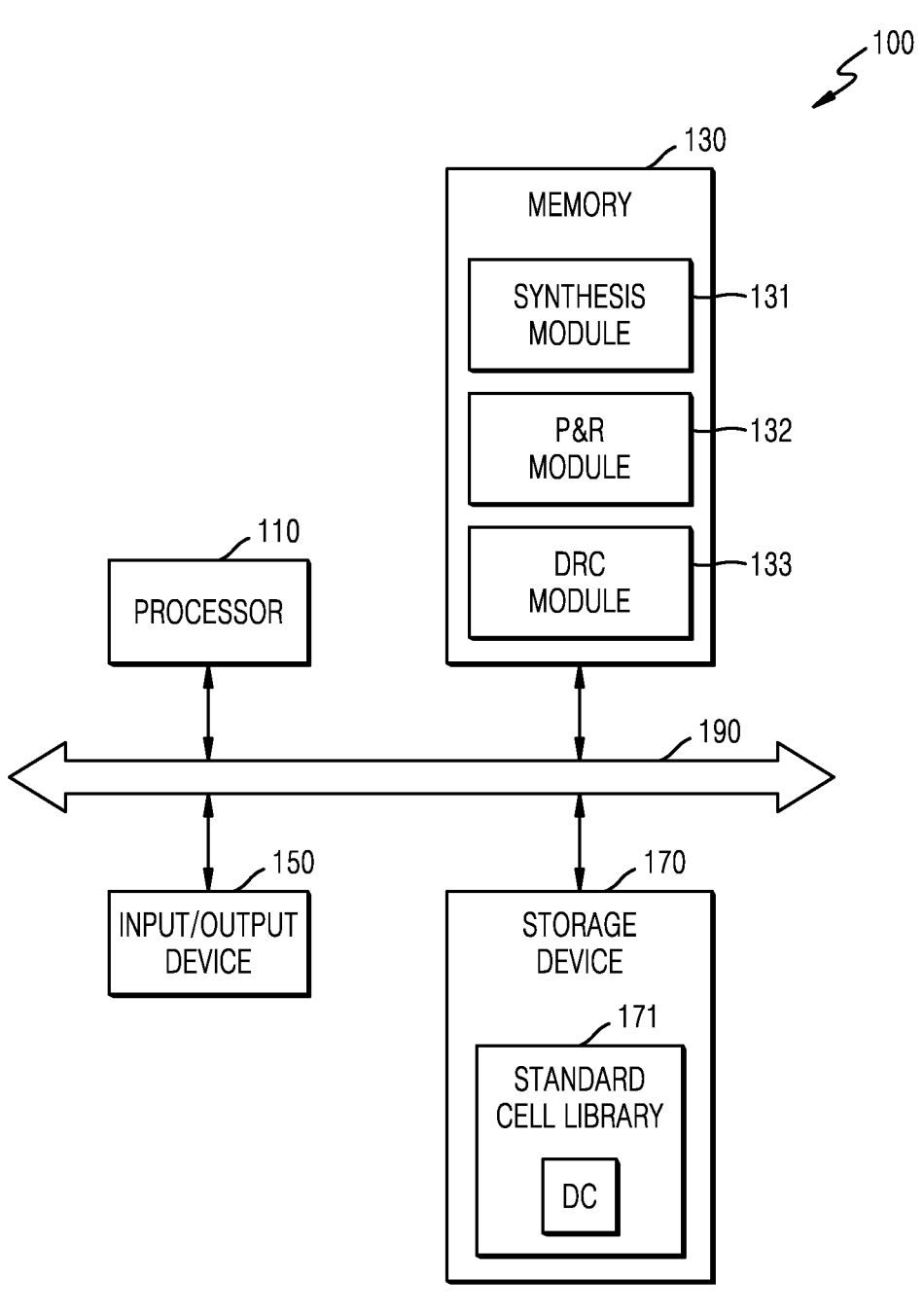
FIG. 13 is a block diagram of a computing system for designing an integrated circuit, according to an example embodiment.

FIG. 13 is a block diagram of a computing system for designing an integrated circuit, according to an example embodiment.

Referring to FIG. 13, a computing system 100 (hereinafter, referred to as an integrated circuit design system) for designing the integrated circuit may include a processor 110, a memory 130, an input/output device 150, a storage device 170, and a bus 190. The integrated circuit design system 100 may perform an IC design operation including operations S10 and S20, and may perform an IC design operation including operations S100 through S400 in FIG. 9 and operations S310 through S340 in FIG. 10. In an embodiment, the integrated circuit design system 100 may be implemented as an integrated device, and accordingly, may be referred to as an IC design device. The integrated circuit design system 100 may be provided as a dedicated device for designing an IC of a semiconductor device, but may also include a computer for driving various simulation tools or design tools. The integrated circuit design system 100 may include a fixed computing system such as a desktop computer, a workstation, and a server, or a portable computing system such as a laptop computer.

The processor 110 may be configured to execute instructions performing at least one of various operations for designing an integrated circuit. For example, the processor 110 may include a core capable of executing an arbitrary command set (for example, Intel Architecture-32 (IA-32), 64-bit expansion IA-32, x86-64, PowerPC, Sparc, MIPS, ARM, IA-64, or the like), such as a micro-processor, application processor (AP), digital signal processor (DSP), and graphics processing unit (GPU). The processor 110 may communicate with the memory 130, the input/output device 150, and the storage device 170 via the bus 190. The processor 110 may perform a design operation of an IC by driving a synthesis module 131, a P&R module 132, and a design rule check (DRC) module 133.

The memory 130 may store the synthesis module 131, the P&R module 132, and the DRC module 133. The synthesis module 131, the P&R module 132, and the DRC module 133 may be loaded into the memory 130 from the storage device 170. The synthesis module 131 may include, for example, a program including a plurality of commands for performing a logic synthesis operation according to operation S10 in FIG. 12. The P&R module 132 may include a program including a plurality of commands for performing a layout design operation according to operation S20 in FIG. 12, operations S100 through S300 in FIG. 9, and operations S310 through S340 in FIG. 10.

The DRC module 133 may determine whether there is a design rule error. The DRC module 133 may include a program including a plurality of commands for performing the DRC operation including the design rule check operation (density rule verification operation) according to operation S400 in FIG. 9. When there is a violation of the design rule, the P&R module 132 may adjust a layout of an arranged cell. When there is no design rule error, the layout design of an IC may be completed.

The memory 130 may include a volatile memory such as static random access memory (RAM) (SRAM) and dynamic RAM (DRAM), or a non-volatile memory such as phase change RAM (PRAM), resistive RAM (ReRAM), nano floating gate memory (NFGM), polymer RAM (PoRAM), magnetic RAM (MRAM), ferroelectric RAM (FRAM), and a flash memory.

The input/output device 150 may control a user input and an output from user interface devices. For example, the input/output device 150 may receive an input data or the like defining an IC, by using an input device such as a keyboard, a mouse, and a touch pad. For example, the input/output device 150 may display placement results, routing results, layout data, DRC results, or the like, by using an output device such as a display and a speaker.

The storage device 170 may store programs such as the synthesis module 131, the P&R module 132, and the DRC module 133, and a program or at least a portion thereof may be loaded into the memory 130 from the storage device 170 before the program is executed by the processor 110. The storage device 170 may store data to be processed by the processor 110 or data processed by the processor 110. For example, the storage device 170 may store data (for example, a standard cell library 171, netlist data, or the like) to be processed by a program such as the synthesis module 131, the P&R module 132, and the DRC module 133, and data (for example, the DRC results, the layout data, or the like) generated by the program.

The standard cell library 171 stored in the storage device 170 may include the standard cell library D10 in FIG. 12. The standard cell library 171 may include data DC defining a layout of a standard cell. The data DC may include data which identifies the function and defines the layout and structure (e.g., internal conductive patterns, sequences of power lines each providing a voltage to each cell, etc.) of the standard cells described with reference to FIGS. 1 through 11C.

For example, the storage device 170 may include a nonvolatile memory such as electrically erasable programmable read-only memory (ROM) (EEPROM), a flash memory, PRAM, RRAM, MRAM, and FRAM, and a storage medium such as a memory card (MMC, eMMC, SD, MicroSD, or the like), solid state drive (SSD), hard disk drive (HDD), a magnetic tape, an optical disk, and a magnetic disk. In addition, the storage device 170 may be removable from the integrated circuit design system 100.

While the inventive concept has been particularly shown and described with reference to embodiments thereof, it will be understood that various changes in form and details may be made therein without departing from the spirit and scope of the following claims.

What is claimed is:

1. An integrated circuit comprising standard cells placed on a plurality of rows extending in a first horizontal direction, the integrated circuit comprising:

a first standard cell continuously placed on a row having a first height in a second horizontal direction perpendicular to the first horizontal direction and a row having a second height in the second horizontal direction, the second height being different from the first height, the first standard cell including first conductive patterns;

a second standard cell continuously placed on a row having the first height in the second horizontal direction and a row having the second height in the second horizontal direction, the second standard cell including second conductive patterns;

a plurality of first power lines formed on boundaries of a first subset of the plurality of rows and configured to supply a first supply voltage to the standard cells; and a plurality of second power lines formed on boundaries of a second subset of the plurality of rows and configured to supply a second supply voltage to the standard cells, wherein the first conductive patterns included in the first standard cell is different from the second conductive patterns included in the second standard cell, wherein the first conductive patterns and the second conductive patterns are formed in the same metal layer, wherein the first standard cell and the second standard cell perform an identical function and have an identical height in the second horizontal direction, and wherein, of the plurality of first power lines and the plurality of second power lines, a placement sequence in the second horizontal direction of a first set of power lines including at least one first power line and at least one second power line supplying a voltage to the first standard cell is different from a placement sequence in the second horizontal direction of a second set of power lines including at least one first power line and at least one second power line supplying a voltage to the second standard cell.

2. The integrated circuit of claim 1, further comprising a third standard cell having one of the first height and the second height and configured to perform an identical function to the first standard cell and the second standard cell.

3. The integrated circuit of claim 1, wherein the plurality of rows comprise rows of the first height and rows of the second height alternately placed at a ratio of 1:1.

4. The integrated circuit of claim 1, wherein the plurality of rows comprise M first rows having the first height and placed adjacent to each other, where Mis a natural number greater than 0, and N second rows having the second height and placed adjacent to each other, where N is a natural number greater than 0.

5. The integrated circuit of claim 4, further comprising a fourth standard cell continuously placed on two or more rows of the first rows, and configured to perform an identical function to the first standard cell and the second standard cell.

6. The integrated circuit of claim 1, wherein the plurality of rows comprise M first rows having the first height, and N second rows having the second height, where M and N are natural numbers greater than 0, and the first rows and the second rows are alternately placed.

7. The integrated circuit of claim 1, wherein the plurality of rows comprise rows having a third height in the second horizontal direction, the third height being different from the first height and the second height.

8. The integrated circuit of claim 1, wherein the plurality of first power lines and the plurality of second power lines are alternately placed at a ratio of 1:1.

9. An integrated circuit comprising standard cells placed on a plurality of rows extending in a first horizontal direction, the integrated circuit comprising:

a first standard cell placed on a row having a first height in a second horizontal direction perpendicular to the first horizontal direction;

a second standard cell continuously placed on two or more rows, each of the two or more rows having the first height;

a third standard cell continuously placed on a row having the first height in the second horizontal direction and a row having a second height in the second horizontal direction, the second height being different from the first height;

a fourth standard cell placed on a row having the first height;

a plurality of first power lines formed on boundaries of a first subset of the plurality of rows and configured to supply a first supply voltage to the standard cells; and a plurality of second power lines formed on boundaries of a second subset of the plurality of rows and configured to supply a second supply voltage to the standard cells, wherein the first standard cell, the second standard cell, the third standard cell, and the fourth standard cell perform an identical function, wherein the first standard cell includes first conductive patterns, the second standard cell includes second conductive patterns, the third standard cell includes third conductive patterns, and the fourth standard cell includes fourth conductive patterns, wherein the first conductive patterns, the second conductive patterns, the third conductive patterns, and the fourth conductive patterns are formed in the same metal layer, wherein the first conductive patterns included in the first standard cell are arranged differently from the fourth conductive patterns included in the fourth standard cell, and wherein, of the plurality of first power lines and the plurality of second power lines, a placement sequence in the second horizontal direction of a first set of power lines including at least one first power line and at least one second power line supplying a voltage to the first standard cell is different from a placement sequence in the second horizontal direction of a second set of power lines including at least one first power line and at least one second power line supplying a voltage to the fourth standard cell.

10. The integrated circuit of claim 9, further comprising:

wherein each of the plurality of first power lines and each of the plurality of second power lines are alternately placed on the boundaries of the plurality of rows.

11. The integrated circuit of claim 10, wherein the first standard cell and the fourth standard cell have an identical height.

12. The integrated circuit of claim 10, further comprising a fifth standard cell having a height in the second horizontal direction identical to a height of the second standard cell and configured to perform an identical function to the second standard cell, wherein, of the plurality of first power lines and the plurality of second power lines, a placement sequence in the second horizontal direction of a first set of power lines including at least one first power line and at least one second power line supplying a voltage to the fifth standard cell is different from a placement sequence in the second horizontal direction of a second set of power lines including at least one first power line and at least one second power line supplying a voltage to the second standard cell.

13. The integrated circuit of claim 10, further comprising a fifth standard cell having an identical height to the third standard cell and configured to perform an identical function to the third standard cell, wherein, of the plurality of first power lines and the plurality of second power lines, a placement sequence in the second horizontal direction of a first set of power lines including at least one first power line and at least one second power line supplying a voltage to the fifth standard cell is different from a placement sequence in the second horizontal direction of a second set of power lines including at least one first power line and at least one second power line supplying a voltage to the third cell.

14. The integrated circuit of claim 9, wherein the plurality of rows comprise M first rows having the first height and placed adjacent to each other, where Mis a natural number greater than 0, and N second rows having the second height and placed adjacent to each other, where N is a natural number greater than 0.

15. The integrated circuit of claim 9, wherein the plurality of rows comprise rows having a third height that is different from the first height and the second height, and comprise rows having a fourth height that is different from the first through third heights.

16. An integrated circuit comprising standard cells placed on a plurality of rows extending in a first horizontal direction, the integrated circuit comprising:

a first standard cell placed on two or more rows, each of the two or more rows having a first height in a second horizontal direction perpendicular to the first horizontal direction;

a second standard cell placed on two or more rows each of which having the first height in the second horizontal direction;

a plurality of first power lines formed on boundaries of a first subset of the plurality of rows and configured to supply a first supply voltage to the standard cells; and a plurality of second power lines formed on boundaries of a second subset of the plurality of rows and configured to supply a second supply voltage to the standard cells, wherein the first standard cell and the second standard cell perform an identical function and have an identical height, wherein, of the plurality of first power lines and the plurality of second power lines, a placement sequence in the second horizontal direction of a first set of power lines including at least one first power line and at least one second power line supplying a voltage to the first standard cell is different from a placement sequence in the second horizontal direction of a second set of power lines including at least one first power line and at least one second power line supplying a voltage to the second standard cell, wherein the first standard cell includes first conductive patterns and the second standard cell includes second conductive patterns, wherein the first conductive patterns and the second conductive patterns are formed in the same metal layer, and wherein the first conductive patterns included in the first standard cell are arranged differently from the second conductive patterns included in the second standard cell.

17. The integrated circuit of claim 16, further comprising a third standard cell having the first height and configured to perform an identical function to the first standard cell and the second standard cell.

18. The integrated circuit of claim 16, further comprising a third standard cell placed on a row having a second height in the second horizontal direction, the second height being different from the first height, and wherein the third standard cell has a height in the second horizontal direction identical to the second height, and the third standard cell is configured to perform an identical function to the first standard cell and the second standard cell.

\* \* \* \* \*